United States Patent
Liu et al.

(10) Patent No.: US 12,328,407 B2
(45) Date of Patent: Jun. 10, 2025

(54) COVER BODY STRUCTURE, BACK COVER, AND ELECTRONIC DEVICE

(71) Applicant: HONOR DEVICE CO., LTD., Shenzhen (CN)

(72) Inventors: Yang Liu, Shenzhen (CN); Lei Feng, Shenzhen (CN); Wei Zhang, Shenzhen (CN); Wenxing Yao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 542 days.

(21) Appl. No.: 17/773,302

(22) PCT Filed: Aug. 30, 2021

(86) PCT No.: PCT/CN2021/115469
§ 371 (c)(1),
(2) Date: Apr. 29, 2022

(87) PCT Pub. No.: WO2022/100213
PCT Pub. Date: May 19, 2022

(65) Prior Publication Data
US 2023/0164256 A1 May 25, 2023

(30) Foreign Application Priority Data
Nov. 11, 2020 (CN) .......................... 202011255192.2

(51) Int. Cl.
*B32B 15/04* (2006.01)
*B32B 17/06* (2006.01)
(Continued)

(52) U.S. Cl.
CPC ....... *H04M 1/0283* (2013.01); *H04M 1/0264* (2013.01); *H05K 5/10* (2025.01)

(58) Field of Classification Search
CPC ..................................................... G06F 1/1637
(Continued)

(56) References Cited

U.S. PATENT DOCUMENTS 8,322,560 B2 * 12/2012 Jiang ..................... H04M 1/026
455/575.8
8,828,196 B2 9/2014 Lönnroth
(Continued)

FOREIGN PATENT DOCUMENTS

CN 102006738 A 4/2011
CN 102006739 A 4/2011
(Continued)

*Primary Examiner* — Lauren R Colgan
(74) *Attorney, Agent, or Firm* — WOMBLE BOND DICKINSON (US) LLP

(57) ABSTRACT

A cover body structure, a back cover, and an electronic device are provided, related to the field of electronic device technologies. The cover body structure includes a glass cover plate, a first ink layer, a first glue layer, and a plastic edge portion. The first ink layer is disposed at least on an edge of the glass cover plate. The first glue layer is disposed on the first ink layer on the edge of the glass cover plate. The plastic edge portion is disposed on the first glue layer on the edge of the glass cover plate. The first glue layer is a glue layer viscous at least at an injection molding temperature of the plastic edge portion, and the first ink layer is an ink layer that is able to withstand the injection molding temperature of the plastic edge portion.

19 Claims, 11 Drawing Sheets

(51) Int. Cl.
*H04M 1/02* (2006.01)
*H05K 5/10* (2025.01)

(58) Field of Classification Search
USPC ..................................... 428/426; 312/223.1
See application file for complete search history.

(56) References Cited

U.S. PATENT DOCUMENTS

| | | | |
|---|---|---|---|
| 2009/0059502 A1 | 3/2009 | Filson et al. | |
| 2011/0050053 A1* | 3/2011 | Deng | H04M 1/0266 312/223.1 |
| 2011/0050054 A1* | 3/2011 | Chang | H04M 1/0266 312/223.1 |
| 2018/0147761 A1* | 5/2018 | Chen | H04B 1/3888 |
| 2019/0082083 A1 | 3/2019 | Jarvis et al. | |

FOREIGN PATENT DOCUMENTS

| | | |
|---|---|---|
| CN | 104797104 A | 7/2015 |
| CN | 104865721 A | 8/2015 |
| CN | 104866019 A | 8/2015 |
| CN | 204595803 U | 8/2015 |
| CN | 105227705 A | 1/2016 |
| CN | 107283727 A | 10/2017 |
| CN | 207339928 U | 5/2018 |
| CN | 108710236 A | 10/2018 |
| CN | 109448542 A | 3/2019 |
| CN | 110785035 A | 2/2020 |
| CN | 211207839 U | 8/2020 |
| CN | 111605132 A | 9/2020 |
| EP | 2258014 A1 | 12/2010 |

* cited by examiner

COVER BODY STRUCTURE, BACK COVER, AND ELECTRONIC DEVICE

This application is a National Stage of International Application No. PCT/CN2021/115469, filed Aug. 30, 2021, which claims priority to Chinese Patent Application No. 202011255192.2, filed Nov. 11, 2020, both of which are hereby incorporated by reference in their entireties.

TECHNICAL FIELD

This application relates to the field of electronic device technologies, and in particular, to a cover body structure, a back cover, and an electronic device.

BACKGROUND

Housings of electronic devices such as smartphones and tablet computers include cover body structures including glass cover plates and plastic edge portions. With the development of technologies and the improvement of people's living standards, users hope that the outer surface of a glass cover plate and the outer surface of a plastic edge portion in such a cover body structure are continuously connected without interruption, to meet the users' requirements for the appearance delicacy of the electronic device. In addition, users hope that the glass cover plate and the plastic edge portion in such a cover body structure are tightly fixed, to improve the structural strength of the housing of the electronic device. However, in the related art, such a cover body structure usually cannot meet the requirements for both the appearance delicacy and the structural strength.

SUMMARY

Embodiments of this application provide a cover body structure, a back cover, and an electronic device, which can improve the structural strength of the cover body structure while ensuring the appearance delicacy of the cover body structure.

To achieve the foregoing objective, the following technical solutions are used in the embodiments of this application:

According to a first aspect, some embodiments of this application provide a cover body structure. The cover body structure includes a glass cover plate, a first ink layer, a first glue layer, and a plastic edge portion. The first ink layer is disposed at least on an edge of the glass cover plate; the first glue layer is disposed on the first ink layer on the edge of the glass cover plate; and the plastic edge portion is disposed on the first glue layer on the edge of the glass cover plate. the first glue layer is a glue layer viscous at least at an injection molding temperature of the plastic edge portion, and the first ink layer is an ink layer that is able to withstand the injection molding temperature of the plastic edge portion.

In the foregoing technical solutions, because the first ink layer and the first glue layer are added between the edge of the glass cover plate and the plastic edge portion, and the bonding strength between an ink material and a glass material is better, the roughness of a surface of the glass cover plate can be improved by using the first ink layer. When the glass cover plate is bonded to the plastic edge portion by using the first glue layer, the first glue layer can penetrate a micro recessed region on a surface of the first ink layer, which increases an actual bonding area between the glass cover plate and the plastic edge portion in a unit region, thereby increasing a bonding force between the glass cover plate and the plastic edge portion. In addition, because the first glue layer is a glue layer viscous at least at the injection molding temperature of the plastic edge portion, and the first ink layer is an ink layer that is able to withstand the injection molding temperature of the plastic edge portion, the plastic edge portion can be molded on the edge of the glass cover plate through an injection molding process to match an edge size of the glass cover plate by using a molten plastic material that does not have a specific shape, thereby ensuring the appearance delicacy of the cover body structure.

In a possible implementation of the first aspect, the glass cover plate includes an outer surface, an inner surface, and a first side surface located between an edge circumference of the outer surface and an edge circumference of the inner surface, the inner surface includes an edge region, the first ink layer is disposed at least on the edge region, the first glue layer is disposed on the first ink layer on the edge region, the plastic edge portion is disposed on the first side surface and the first glue layer on the edge region, the plastic edge portion is disposed around an edge circumference of the glass cover plate, and the plastic edge portion and the glass cover plate enclose an accommodating groove on a side of the inner surface away from the outer surface. In this way, a part of the first side surface close to the outer surface and a part of the first side surface close to the inner surface do not need to be provided with step surfaces through a computer numerical control processing technology, and therefore, a processing technology of the cover body structure is simple.

In a possible implementation of the first aspect, an inner surface of the plastic edge portion is provided with at least three first positioning post pull-out holes, the at least three first positioning post pull-out holes are evenly arranged around the edge circumference of the glass cover plate, the first positioning post pull-out hole extends along a direction perpendicular to the glass cover plate, and a partial region of the edge region and a partial region of the first side surface form a partial inner surface region of the first positioning post pull-out hole. In this way, the first positioning post pull-out hole can avoid a positioning post, so that the glass cover plate can be positioned on an injection molding machine by using at least three positioning posts.

In a possible implementation of the first aspect, the first glue layer is a thermally activated glue layer, activated in a first temperature range, and solidified in a second temperature range; the first temperature range includes the injection molding temperature of the plastic edge portion; and a maximum temperature value of the second temperature range is less than a minimum temperature value of the first temperature range. In this way, after the first glue layer is disposed on the first ink layer on the edge of the glass cover plate, the first glue layer may be heated or cooled to the second temperature range to solidify the first glue layer, which helps to transport the glass cover plate provided with the first ink layer and the first glue layer to the injection molding machine, thereby avoiding an undesirable phenomenon such as being bonded to another device or being scraped during transportation.

In a possible implementation of the first aspect, the thermally activated glue layer is in a fluid state and viscous at a temperature of 200° C. to 400° C., and is in a solid state and not viscous at 0° C. to 40° C.

In a possible implementation of the first aspect, the second temperature range includes a temperature range in a normal temperature state. In this way, after the first glue layer is disposed on the first ink layer on the edge of the glass cover plate, the first glue layer can be solidified as long as the first glue layer is cooled to a normal temperature. Therefore, no other heating or cooling device is needed to maintain the temperature of the first glue layer to keep the first glue layer in a solidified state during transportation.

In a possible implementation of the first aspect, a material of the first glue layer includes at least one of organic silica glue, phenolic resin glue, urea-formaldehyde resin glue, temperature-resistant epoxy glue, or polyimide glue.

In a possible implementation of the first aspect, the glass cover plate includes an outer surface, an inner surface, and a first side surface located between an edge circumference of the outer surface and an edge circumference of the inner surface, the glass cover plate further includes a first step surface and a second side surface, the first step surface is located outside an edge of the outer surface, both the first step surface and the outer surface face a side that is of a plane on which the outer surface is located and that is away from a plane on which the inner surface is located, the first step surface has an outer edge away from a center of the outer surface and an inner edge close to the center of the outer surface, the outer edge of the first step surface is connected to an edge of the first side surface close to the outer surface, the second side surface is connected between the inner edge of the first step surface and the outer surface, and a distance from the first step surface to the inner surface is less than a distance from the outer surface to the inner surface; and the first ink layer is disposed at least on the first step surface, the first glue layer is disposed at least on the first ink layer on the first step surface, and the plastic edge portion is disposed on the first side surface, the first glue layer on the first step surface, and the second side surface. In this way, when the plastic edge portion is molded on the first side surface, the first glue layer on the first step surface, and the second side surface through an injection molding process, an outer surface of the plastic edge portion can be continuously connected to the outer surface of the glass cover plate, thereby ensuring the appearance delicacy of the cover body structure. Both the first step surface and the outer surface face the side that is of the plane on which the outer surface is located and that is away from the plane on which the inner surface is located, the first ink layer is disposed on the first step surface, and the first glue layer is disposed on the first ink layer on the first step surface, thereby facilitating the arrangement of the first ink layer and the first glue layer on the edge of the glass cover plate. The plastic edge portion is disposed on the first side surface on the edge of the glass cover plate, the first glue layer on the first step surface, and the second side surface, and the plastic edge portion can form an inward buckling structure. When the cover body structure is applied to a housing of the electronic device, the plastic edge portion can apply a force directed to an inner side of the glass cover plate to the glass cover plate, to prevent the glass cover plate from falling off the plastic edge portion.

In a possible implementation of the first aspect, an edge of the first side surface close to the inner surface is connected to the edge circumference of the inner surface.

In a possible implementation of the first aspect, a central region of the inner surface is provided with at least one positioning groove. The at least one positioning groove is used for cooperating with positioning posts on the injection molding machine to fix the glass cover plate provided with the first ink layer and the first glue layer to a preset position on the injection molding machine, to facilitate a subsequent operation of molding the plastic edge portion on the edge of the glass cover plate.

In a possible implementation of the first aspect, the positioning groove is a circular groove, and there are a plurality of positioning grooves.

In a possible implementation of the first aspect, the positioning groove is a rectangular groove, a square groove, a triangular groove, or a kidney-shaped groove, and there is one positioning groove.

In a possible implementation of the first aspect, the glass cover plate further includes a second step surface and a third side surface, the second step surface is located outside an edge of the inner surface, both the second step surface and the inner surface face a side that is of the plane on which the inner surface is located and that is away from the plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and the plastic edge portion is further disposed on the second step surface and the third side surface. In this way, a bonding area between the plastic edge portion and the glass cover plate can be increased by using the second step surface and the third side surface, thereby further increasing a bonding force between the plastic edge portion and the glass cover plate, and improving the structural strength of the cover body structure. The second step surface and the third side surface may further cooperate with positioning posts to position the glass cover plate on the injection molding machine.

In a possible implementation of the first aspect, the glass cover plate further includes a second step surface and a third side surface, the second step surface is located outside an edge of the inner surface, both the second step surface and the inner surface face a side that is of the plane on which the inner surface is located and that is away from the plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and the first ink layer is further disposed on the second step surface, the first glue layer is further disposed on the first ink layer on the second step surface, and the plastic edge portion is further disposed on the first glue layer on the second step surface and the third side surface. In this way, a bonding area between the plastic edge portion and the glass cover plate can be increased by using the second step surface and the third side surface, a bonding force between the plastic edge portion and the second step surface in a unit area can be also increased by using the first ink layer and the first glue layer that are on the second step surface, thereby further increasing a bonding force between the plastic edge portion and the glass cover plate, and improving the structural strength of the cover body structure. The second step surface and the third side surface may further cooperate with positioning posts to position the glass cover plate on the injection molding machine.

In a possible implementation of the first aspect, the glass cover plate includes an outer surface, an inner surface, and a first side surface located between an edge circumference of the outer surface and an edge circumference of the inner surface, an edge of the first side surface close to the outer surface is connected to an edge circumference of the outer surface, the glass cover plate further includes a second step surface and a third side surface, the second step surface is located outside an edge of the inner surface, both the second step surface and the inner surface face a side that is of a plane on which the inner surface is located and that is away from a plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and the first ink layer is disposed on the second step surface, the first glue layer is disposed on the first ink layer on the second step surface, the plastic edge portion is disposed on the first side surface, the first glue layer on the second step surface, and the third side surface. In this way, both the second step surface and the inner surface face the side that is of the plane on which the inner surface is located and that is away from the plane on which the outer surface is located, the first ink layer is disposed on the second step surface, and the first glue layer is disposed on the first ink layer on the second step surface, thereby facilitating the arrangement of the first ink layer and the first glue layer on the edge of the glass cover plate. The second step surface and the third side surface may further cooperate with positioning posts to position the glass cover plate on the injection molding machine.

In a possible implementation of the first aspect, there are a plurality of second step surfaces, the plurality of second step surfaces are arranged along the edge of the inner surface, and outer edges of the plurality of second step surfaces are all connected to the first side surface; and there are also a plurality of third side surfaces, a quantity of the plurality of third side surfaces is equal to a quantity of the plurality of second step surfaces, the plurality of third side surfaces are in a one-to-one correspondence to the plurality of second step surfaces, and each third side surface is connected between an inner edge of the second step surface corresponding to the third side surface and the inner surface. The structure is simple, and there are fewer computer numerical control processing regions on the glass cover plate.

In a possible implementation of the first aspect, the plurality of second step surfaces include at least three second step surfaces evenly arranged around the edge circumference of the inner surface, positions that are on an inner surface of the plastic edge portion and that correspond to the at least three second step surfaces are provided with second positioning post pull-out holes, the second positioning post pull-out hole extends along a direction perpendicular to the glass cover plate, and the second step surface and the third side surface connected to the second step surface form a partial inner surface region of the second positioning post pull-out hole. In this way, the second positioning post pull-out hole can avoid the positioning post, so that the glass cover plate can be positioned on the injection molding machine by using the at least three positioning posts, which is simple and easy to implement.

In a possible implementation of the first aspect, the second step surface is disposed around the edge circumference of the inner surface, and the third side surface is disposed around the edge circumference of the inner surface. The structure is simple, and it is convenient to operate when the second step surface is processed by computer numerical control.

In a possible implementation of the first aspect, the second step surface includes at least three step surface regions, the at least three step surface regions are evenly arranged around the edge circumference of the inner surface, positions that are on an inner surface of the plastic edge portion and that correspond to the at least three step surface regions are provided with second positioning post pull-out holes, the second positioning post pull-out hole extends along a direction perpendicular to the glass cover plate, and the step surface region and a partial region of the third side surface connected to the step surface region form a partial inner surface region of the second positioning post pull-out hole. In this way, the glass cover plate is positioned on the injection molding machine by using the at least three positioning posts, which is simple and easy to implement.

In a possible implementation of the first aspect, the first ink layer includes at least one of a color ink layer, a black ink layer, a white ink layer, or a transparent ink layer.

In a possible implementation of the first aspect, the first ink layer is disposed on the edge of the glass cover plate through at least one of a glass direct molding process, a silk screen printing process, or a pad printing process.

According to a second aspect, some embodiments of this application provide a back cover. The back cover includes a back cover body and the cover body structure according to any one of the technical solutions of the first aspect. The back cover body includes an outer surface and an inner surface opposite to each other, and an opening passing through the outer surface of the back cover body and the inner surface of the back cover body is provided on the back cover body; and the cover body structure is disposed at the opening, an orientation of an outer surface of a glass cover plate of the cover body structure is the same as an orientation of the outer surface of the back cover body, and a plastic edge portion of the cover body structure is fixed to an edge of the back cover body at the opening.

According to the foregoing solutions, the back cover includes the cover body structure according to any one of the technical solutions of the first aspect. Because the structural strength and appearance delicacy of the cover body structure are better, improvements in the structural strength and appearance delicacy of the back cover are facilitated.

In a possible implementation of the second aspect, the back cover further includes a second ink layer and a second glue layer. The second ink layer is disposed at least on the edge of the back cover body at the opening. The second glue layer is disposed on the second ink layer on the edge of the back cover body at the opening. The plastic edge portion is further disposed on the second glue layer on the edge of the back cover body at the opening. The second glue layer is a glue layer viscous at least at an injection molding temperature of the plastic edge portion, and the second ink layer is an ink layer that is able to withstand the injection molding temperature of the plastic edge portion. In this way, the plastic edge portion of the cover body structure and the edge of the back cover body at the opening can be molded into a whole through an injection molding process. The structure is simple with relatively high bonding strength while ensuring the appearance delicacy of the back cover.

According to a third aspect, some embodiments of this application provide an electronic device. The electronic device includes a camera module and the cover body structure according to any one of the technical solutions of the first aspect or includes a camera module and the back cover according to any one of the technical solutions of the second aspect. The camera module is disposed on an inner side of the cover body structure, and a light-incident surface of the camera module faces a glass cover plate of the cover body structure.

In the foregoing technical solutions, because the electronic device includes the cover body structure according to any one of the technical solutions of the first aspect or the back cover according to any one of the technical solutions of the second aspect, the back cover according to any one of the technical solutions of the second aspect includes the cover body structure according to any one of the technical solutions of the first aspect, and the structural strength and appearance delicacy of the cover body structure are better, improvements in the structural strength and appearance delicacy of the electronic device are facilitated.

In a possible implementation of the third aspect, the camera module is a rear-facing camera module.

BRIEF DESCRIPTION OF DRAWINGS

FIG. 1B is an exploded view of the electronic device shown in FIG. 1a;

DESCRIPTION OF EMBODIMENTS

In the embodiments of this application, terms "first" and "second" are used merely for the purpose of description, and shall not be construed as indicating or implying relative importance or implying a quantity of indicated technical features. Therefore, features defining "first" and "second" may explicitly or implicitly include one or more such features.

It should be noted that, in the embodiments of this application, the terms "include", "comprise", and any variants thereof are intended to cover a non-exclusive inclusion. Therefore, in the context of a process, method, object, or apparatus that includes a series of elements, the process, method, object, or apparatus not only includes such elements, but also includes other elements not specified expressly, or may include inherent elements of the process, method, object, or apparatus. Without more limitations, elements defined by the sentence "including one" does not exclude that there are still other same elements in the processes, methods, objects, or apparatuses.

This application provides an electronic device. The electronic device may be a portable electronic apparatus or another suitable electronic apparatus. For example, the electronic device may be a notebook computer, a tablet computer, a smaller device such as a mobile phone, a watch, a pendant device or another wearable or micro device, a cellular phone, or a media player.

Figure 1A:
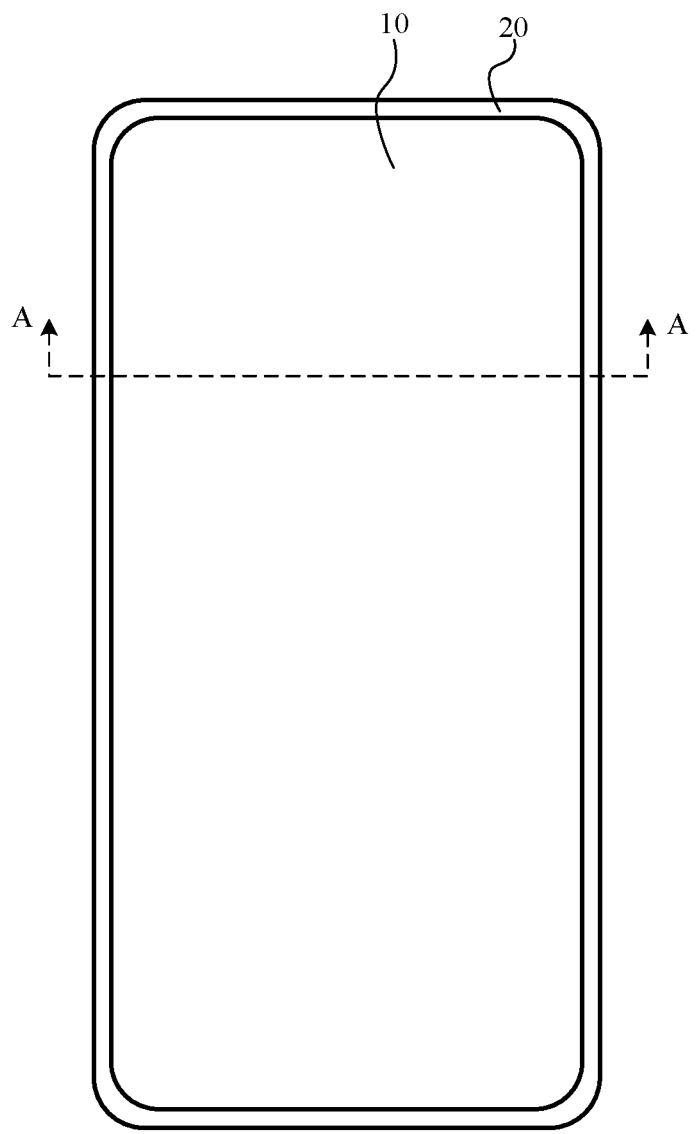
FIG. 1a is a front view of an electronic device according to some embodiments of this application.
Figure 1B:
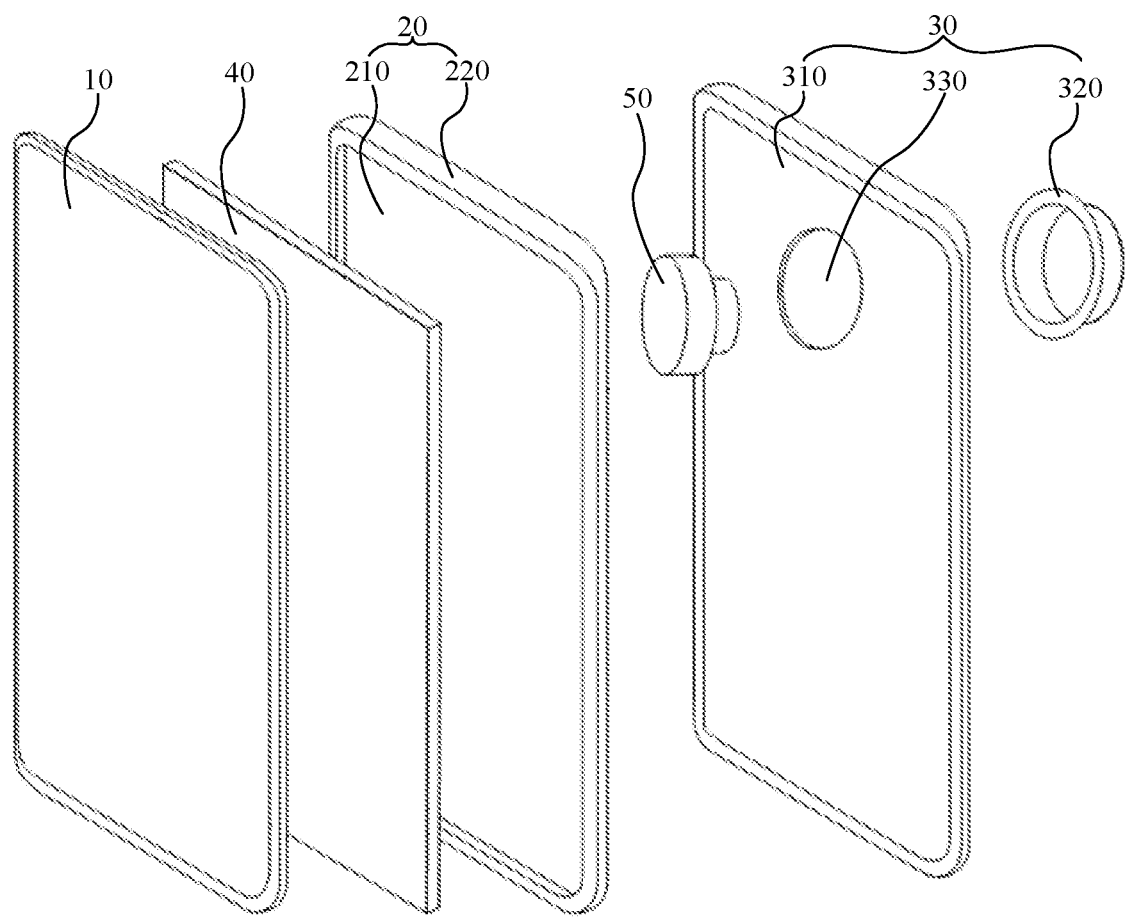
Figure 1C:
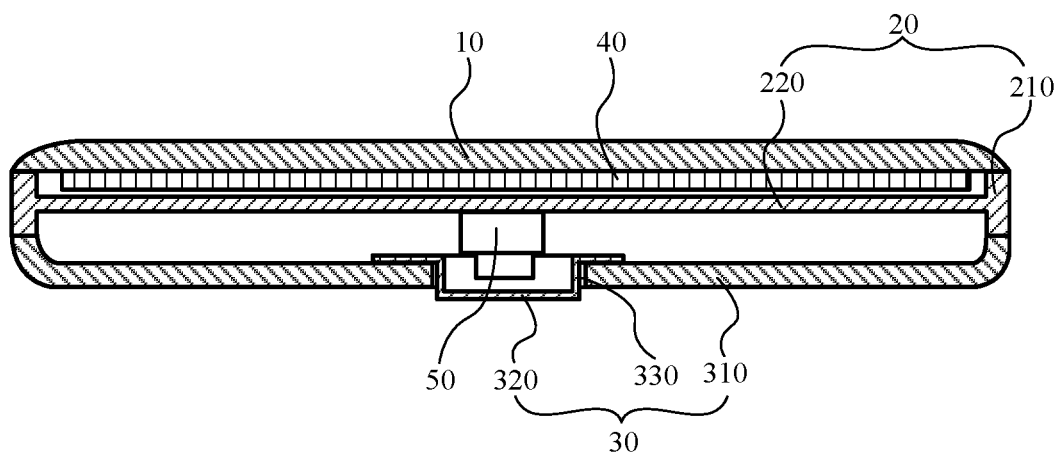
FIG. 1c is a schematic cross-sectional structural diagram of the electronic device shown in FIG. 1a along an A-A direction.

FIG. 1a is a front view of an electronic device according to some embodiments of this application. FIG. 1B is an exploded view of the electronic device shown in FIG. 1a. FIG. 1c is a schematic cross-sectional structural diagram of the electronic device shown in FIG. 1a along an A-A direction. In the embodiments, the electronic device is a mobile phone. The electronic device includes a front cover plate 10, a middle frame 20, a back cover 30, a display module 40, and a camera module 50.

The middle frame 20 includes a middle plate 210 and a frame 220 arranged around an edge circumference of the middle plate 210. The front cover plate 10 and the back cover 30 are stacked on two opposite sides of the middle plate 210 and fixed to the frame 220. The front cover plate 10, the back cover 30, and the frame 220 form a part of a housing of the electronic device.

The display module 40 is configured to display an image or a video. The display module 40 is attached to a surface of the front cover plate 10 close to the middle plate 210. A display surface of the display module 40 faces the front cover plate 10. The front cover plate 100 is configured to protect the display module 40 and transmit image light of the display module 40.

The camera module 50 is a rear-facing camera module. The camera module 50 is disposed between the middle plate 210 and the back cover 30. At present, due to the limitation of the structural complexity, a size of the camera module 50 along an optical axis is difficult to shrink. In addition, as users pursue an ultra-thin electronic device body, an electronic device is becoming increasingly thin. Therefore, to avoid the camera module 50, the back cover 30 includes a back cover body 310. An opening 330 is provided on the back cover body 310. An object side end of the camera module 50 (that is, an end of the camera module 50 close to a photographed landscape during working) stretches into the opening 330. On this basis, in order to protect the camera module, the back cover 30 further includes a decorative cover 320. The decorative cover 320 is installed at the opening 330 and fixed to an edge of the back cover at the opening 330. The decorative cover 320 covers the object side end of the camera module 50 to protect the camera module 50, and the decorative cover 320 is provided with a light-transmissive region. The light-transmissive region is opposite to a light-incident surface of the camera module 50. The decorative cover 320 also forms a part of the housing of the electronic device.

Because the glass cover plate is characterized by good light transmission and low price, and the plastic is characterized by being easy to form a curved appearance and low costs, the cover body structure including the glass cover plate and a plastic edge portion disposed on an edge of the glass cover plate has been widely applied to the electronic device shown in FIG. 1a to FIG. 1c. For example, the front cover plate 10 includes a light-transmissive glass cover plate and a plastic edge portion disposed on an edge of the glass cover plate. The plastic edge portion is configured to meet 2.5D or 3D appearance design requirements of the front cover plate 10. In another example, the decorative cover 320 includes a glass cover plate and a plastic edge portion disposed around an edge circumference of the glass cover plate. The plastic edge portion is configured to fix relative positions of the glass cover plate and the back cover 30 and seal a gap between the edge circumference of the glass cover plate and the edge circumference of the back cover at the opening 330.

To mold the cover body structure including the glass cover plate and the plastic edge portion, the glass cover plate and the plastic edge portion may be molded separately, and the glass cover plate and the plastic edge portion with a determinate shape are then assembled through gluing. However, in this way, a gap usually occurs between the glass cover plate and a plastic frame due to the limitation of processing accuracy or assembly accuracy, which makes it difficult to ensure the appearance delicacy of the cover body structure. To resolve the problem, the plastic edge portion may be directly molded on the edge of the glass cover plate through an injection molding process to match an edge size of the glass cover plate by using a molten plastic material in an indeterminate shape, thereby avoiding occurrence of a gap between the plastic edge portion and the glass cover plate, and further ensuring the appearance delicacy of the cover body structure. However, due to a weak bonding force between glass and plastic, if the plastic edge portion is directly molded on a surface of the glass cover plate, the connection strength between the plastic edge portion and the glass cover plate is relatively low, which further causes relatively low structural strength of the cover body structure.

In order to improve the structural strength of the cover body structure while ensuring the appearance delicacy of the cover body structure, this application provides a cover body structure. The cover body structure forms a part of the housing of the electronic device. Specifically, the cover body structure may be a front cover plate of the electronic device or a decorative cover of a camera module of the electronic device, which is not specifically limited herein.

Figure 2A:
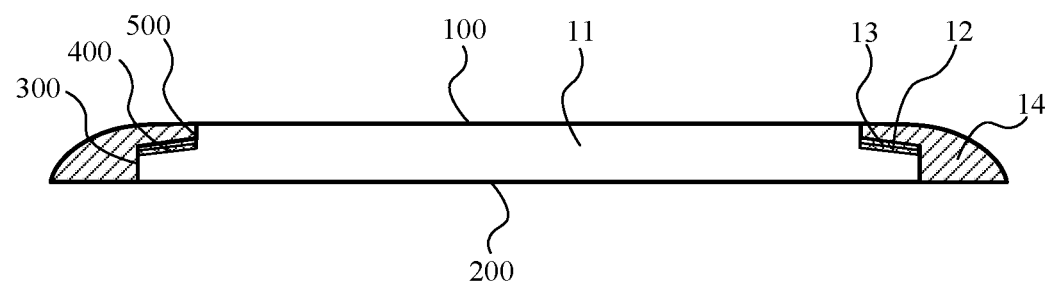
FIG. 2a is a schematic cross-sectional structural diagram of a cover body structure according to some embodiments of this application.

FIG. 2a is a schematic cross-sectional structural diagram of a cover body structure 1 according to some embodiments of this application. The cover body structure 1 includes a glass cover plate 11, a first ink layer 12, a first glue layer 13, and a plastic edge portion 14.

The material of the glass cover plate 11 is glass, and the shape of the glass cover plate 11 includes, but is not limited to, a circular flat plate shape, an elliptical flat plate shape, a triangular flat plate shape, a square flat plate shape, and a polygonal flat plate shape.

The glass cover plate 11 includes an outer surface 100 and an inner surface 200 opposite to each other, and a first side surface 300 located between an edge circumference of the outer surface 100 and an edge circumference of the inner surface 200.

The outer surface 100 refers to a surface facing the outside of an electronic device when the glass cover plate 11 is applied to the electronic device, and the outer surface 100 is a plane.

The inner surface 200 refers to a surface facing the inside of the electronic device when the glass cover plate 11 is applied to the electronic device, and the inner surface 200 is a plane parallel to the outer surface 100.

The first side surface 300 is an annular surface surrounding the edge circumference of the outer surface 100 (or the inner surface 200). The first side surface 300 may be perpendicular to the outer surface 100 (or the inner surface 200), or may tilt relative to the outer surface 100 (or the inner surface 200). This is not specifically limited herein. In the embodiment shown in FIG. 2a, the first side surface 300 is perpendicular to the outer surface 100 (or the inner surface 200). This cannot be considered as a special limitation on this application.

An edge of the first side surface 300 close to the outer surface 100 may be connected to the edge circumference of the outer surface 100, or may be separated from a part of an edge of the outer surface 100 by using a middle surface, or may be separated from the edge circumference of the outer surface 100 by using a middle surface. This is not specifically limited herein. In the embodiment shown in FIG. 2a, the edge of the first side surface 300 close to the outer surface 100 is separated from the edge circumference of the outer surface 100 by using a middle surface including a first step surface 400 and a second side surface 500. This cannot be considered as a special limitation on this application.

Similarly, an edge of the first side surface 300 close to the inner surface 200 may be connected to the edge circumference of the inner surface 200, or may be separated from a part of an edge of the inner surface 200 by using a middle surface, or may be separated from the edge circumference of the inner surface 200 by using a middle surface. This is not specifically limited herein. In the embodiment shown in FIG. 2a, the edge of the first side surface 300 close to the inner surface 200 is connected to the edge circumference of the inner surface 200. This cannot be considered as a special limitation on this application.

In this embodiment of this application, an edge region of the outer surface 100, a middle surface between the outer surface 100 and the first side surface 300, the first side surface 300, a middle surface between the first side surface 300 and the inner surface 200, and an edge region of the inner surface 200 form an edge of the glass cover plate 11.

The first ink layer 12 may be at least one of a black ink layer, a color ink layer, a white ink layer, or a transparent ink layer. This is not specifically limited herein.

The first ink layer 12 is disposed at least on the edge of the glass cover plate 11. That is, the first ink layer 12 may be disposed on only the edge of the glass cover plate 11, or the first ink layer 12 may be disposed on another region of the glass cover plate 11 such as a central region of the inner surface 200 in addition to the edge of the glass cover plate 11.

A part of the first ink layer 12 disposed on the edge of the glass cover plate 11 may be disposed on a partial region of the edge of the glass cover plate 11, for example, the edge region of the outer surface 100, the middle surface between the outer surface 100 and the first side surface 300, the middle surface between the first side surface 300 and the inner surface 200, or the edge region of the inner surface 200, or may be disposed on an entire region of the edge of the glass cover plate 11. This is not specifically limited herein.

The first ink layer 12 may be disposed at least on the edge of the glass cover plate 11 through at least one of a glass direct molding (glass direct molding, GDM) process, a silk screen printing process, or a pad printing process. This is not specifically limited herein.

The first glue layer 13 is disposed on the first ink layer 12 on the edge of the glass cover plate 11. In some embodiments, the first glue layer 13 may be disposed on the first ink layer 12 on the edge of the glass cover plate 11 through at least one of a blade coating process, a roll coating process, a dip coating process, or a spray coating process. This is not specifically limited herein.

The material of the plastic edge portion 14 includes, but is not limited to, at least one of polyethylene glycol terephthalate (polyethylene glycol terephthalate, PET), polyphenylene sulfide (polyphenylene sulfide, PPS), or polyethylene (polyethylene, PE).

The plastic edge portion 14 is molded at least on the first glue layer 13 on the edge of the glass cover plate 11 through an injection molding process. That is, the plastic edge portion 14 is molded on the edge of the glass cover plate 11 through an injection molding process, and at least a part of the plastic edge portion 14 covers the first glue layer 13.

The plastic edge portion 14 may be molded on one side edge of the glass cover plate 11, two side edges opposite to each other, or three adjacent side edges, or may be molded on the edge circumference of the glass cover plate 11. This is not specifically limited herein. In the embodiment shown in FIG. 2a, the plastic edge portion 14 is molded on the edge circumference of the glass cover plate 11 through an injection molding process. This cannot be considered as a special limitation on this application.

The injection molding process of the plastic edge portion 14 may be as follows: First, the glass cover plate 11 provided with the first ink layer 12 and the first glue layer 13 is carried on and fixed to a preset position on an injection molding machine; second, an injection mold is closed (that is, a mold closing process), to enclose a mold cavity with the same shape as a contour shape of the plastic edge portion 14, and connect the mold cavity to the edge of the glass cover plate 11; next, a molten plastic material is injected into the mold cavity by using pressure, and the molten plastic material is bonded at least to the first glue layer 13 on the edge of the glass cover plate 11; and finally, the plastic material is cooled to solidify the plastic material, and the solidified plastic material is the plastic edge portion 14.

The plastic edge portion 14 is molded at least on the first glue layer 13 on the edge of the glass cover plate 11 through an injection molding process, and during the injection molding process, the plastic material in a molten state is in contact with the first glue layer 13. Therefore, to avoid a case that the first glue layer 13 loses viscosity during the injection molding process, the first glue layer 13 needs to be a glue layer viscous at least at an injection molding temperature of the plastic edge portion 14 (that is, a temperature of the plastic material in a molten state). For example, if the injection molding temperature of the plastic edge portion 14 is 380° C. to 400° C., the first glue layer 13 is a glue layer viscous at least at a temperature of 380° C. to 400° C.

The first glue layer 13 may be a glue layer viscous at all temperatures, or may be a glue layer viscous only at the injection molding temperature of the plastic edge portion 14, or may be a glue layer viscous in a relatively large temperature range including the injection molding temperature of the plastic edge portion 14. This is not specifically limited herein.

In some embodiments, the first glue layer 13 is a thermally activated glue layer. The thermally activated glue layer is a type of glue layer that is in a fluid state and viscous at a relatively high temperature and that is solid and not viscous at a relatively low temperature. For example, the thermally activated glue layer is in a fluid state and viscous at a temperature of 200° C. to 400° C., and is solid and not viscous at 0° C. to 40° C. Specifically, the first glue layer 13 is activated in a first temperature range. In this case, the first glue layer 13 is viscous. The first temperature range includes the injection molding temperature of the plastic edge portion 14. Specifically, the first temperature range may include only the injection molding temperature of the plastic edge portion 14, or may be a relatively large temperature range including the injection molding temperature of the plastic edge portion 14. This is not specifically limited herein. The first glue layer 13 is solidified in a second temperature range. A maximum temperature value of the second temperature range is less than a minimum temperature value of the first temperature range. In this way, after the first glue layer 13 is disposed on the first ink layer 12 on the edge of the glass cover plate 11, the first glue layer 13 may be heated or cooled to the second temperature range to solidify the first glue layer 13, which helps to transport the glass cover plate 11 provided with the first ink layer 12 and the first glue layer 13 to the injection molding machine, thereby avoiding an undesirable phenomenon such as being bonded to another device or being scraped during transportation.

In the foregoing embodiment, specific values of the first temperature range and the second temperature range are not limited, as long as the first temperature range includes the injection molding temperature of the plastic edge portion 14 and the maximum temperature value of the second temperature range is less than the minimum temperature value of the first temperature range.

In some embodiments, the second temperature range of the first glue layer 13 includes a temperature range in a normal temperature state. In this way, after the first glue layer 13 is disposed on the first ink layer 12 on the edge of the glass cover plate 11, the first glue layer 13 can be solidified as long as the first glue layer 13 is cooled to a normal temperature. Therefore, no other heating or cooling device is needed to maintain the temperature of the first glue layer 13 to keep the first glue layer 13 in a solidified state during transportation.

A material of the first glue layer 13 may include at least one of organic silica glue, phenolic resin glue, urea-formaldehyde resin glue, temperature-resistant epoxy glue, or polyimide glue. This is not specifically limited herein.

Similarly, the plastic edge portion 14 is molded at least on the first glue layer 13 on the edge circumference of the glass cover plate 11 through an injection molding process; and during the injection molding process, the plastic material in a molten state is in contact with the first glue layer 13, the first ink layer 12 is adjacent to the first glue layer 13, and the temperature of the plastic material in a molten state is inevitably transferred to the first ink layer 12. Therefore, in order to prevent an undesirable phenomenon such as discoloring or falling off the glass cover plate 11 due to being heated from occurring in the first ink layer 12, the first ink layer 12 needs to be an ink layer that can withstand the injection molding temperature of the plastic edge portion 14. For example, if the injection molding temperature of the plastic edge portion 14 is 380° C. to 400° C., the first ink layer 12 is an ink layer that can withstand a temperature of 400° C. In another example, if the injection molding temperature of the plastic edge portion 14 is 380° C., the first ink layer 12 is an ink layer that can withstand a temperature of 380° C.

In this embodiment of this application, because the plastic edge portion 14 is molded on the edge of the glass cover plate 11 through an injection molding process and matches an edge size of the glass cover plate 11 in this process by using a molten plastic material that does not have a specific shape, an outer surface of the plastic edge portion 14 can be continuously connected to the outer surface of the glass cover plate 11, thereby ensuring the appearance delicacy of the cover body structure 1. In addition, because the first ink layer 12 is disposed at least on the edge of the glass cover plate 11, and a bonding force per unit area between an ink layer and glass is greater than a bonding force in a unit bonding area between plastic and glass when the plastic is directly molded on the glass through an injection molding process, it can be learned that a bonding force between the first ink layer 12 and the glass cover plate 11 is larger. Further, the first glue layer 13 is disposed at least on the first ink layer 12 on the edge of the glass cover plate 11, a bonding force per unit area between a glue layer and ink is also greater than a bonding force in a unit bonding area between plastic and glass when the plastic is directly molded on the glass through an injection molding process. Therefore, it can be learned that a bonding force between the first glue layer 13 and the first ink layer 12 is larger. Still further, because the plastic edge portion 14 is disposed at least on the first glue layer 13 on the edge of the glass cover plate 11 through an injection molding process, and a bonding force per unit area between plastic and a glue layer is greater than a bonding force in a unit bonding area between plastic and glass when the plastic is directly molded on the glass through an injection molding process, a bonding force between the plastic edge portion 14 and the first glue layer 13 is larger. Based on the above, bonding forces per unit area of bonding surfaces of different media between the edge of the glass cover plate 11 and the plastic edge portion 14 are all greater than a bonding force in a unit bonding area between plastic and glass when the plastic is directly molded on the glass through an injection molding process. Therefore, the structural strength of the cover body structure 1 provided in this embodiment of this application is larger.

In the foregoing embodiment, structure forms of the edge of the glass cover plate 11 may be various. Correspondingly, disposition positions of the first ink layer 12, the first glue layer 13, and the plastic edge portion 14 are also different. Specifically, the structure forms of the edge of the glass cover plate 11 and the disposition positions of the first ink layer 12, the first glue layer 13, and the plastic edge portion 14 may include the following embodiment 1 to embodiment 3.

Embodiment 1: Still referring to FIG. 2a, the glass cover plate 11 includes the outer surface 100, the inner surface 200, and the first side surface 300 located between the edge circumference of the outer surface 100 and the edge circumference of the inner surface 200. In addition, the glass cover plate 11 further includes a first step surface 400 and a second side surface 500.

In some embodiments, the first step surface 400 and the second side surface 500 are processed and molded by using a milling cutter on a computer numerical control (computer numerical control, CNC) machine tool.

The first step surface 400 is located outside an edge of the outer surface 100. That is, the first step surface 400 is located on a side of the edge of the outer surface 100 away from a center of the outer surface 100.

The first step surface 400 may be a relatively small surface located outside one side edge of the outer surface 100, or may be a relatively large annular surface disposed around an edge circumference of the outer surface 100. This is not specifically limited herein. In the embodiment shown in FIG. 2a, the first step surface 400 is an annular surface disposed around the edge circumference of the outer surface 100. This cannot be considered as a special limitation on this application.

Both the first step surface 400 and the outer surface 100 face a side that is of a plane on which the outer surface 100 is located and that is away from a plane on which the inner surface 200 is located. In other words, that is, if a part of space located on the side that is of the plane on which the outer surface 100 is located and that is away from the plane on which the inner surface 200 is located is defined as an outer space of the glass cover plate 11, the first step surface 400 and the outer surface 100 are both opposite to the outer space of the glass cover plate 11.

The first step surface 400 has an outer edge disposed away from the center of the outer surface 100 and an inner edge disposed close to the center of the outer surface 100. The outer edge of the first step surface 400 is connected to an edge of the first side surface 300 close to the outer surface 100. The second side surface 500 is connected between the inner edge of the first step surface 400 and the outer surface 100. A distance from the first step surface 400 to the inner surface 200 is less than a distance from the outer surface 100 to the inner surface 200. That is, a distance from each part of the first step surface 400 to the inner surface 200 is less than the distance from the outer surface 100 to the inner surface 200.

The first step surface 400 may be a plane or a curved surface. This is not specifically limited herein. When the first step surface 400 is a plane, the first step surface 400 may be parallel to the outer surface 100 (or the inner surface 200), or may tilt relative to the outer surface 100 (or the inner surface 200). This is not specifically limited herein.

The second side surface 500 may be a plane or a curved surface. This is not specifically limited herein. The second side surface 500 may be perpendicular to the outer surface 100 (or the inner surface 200), or may tilt relative to the outer surface 100 (or the inner surface 200). This is not specifically limited herein.

The first ink layer 12 is disposed at least on the first step surface 400, the first glue layer 13 is disposed at least on the first ink layer 12 on the first step surface 400, and the plastic edge portion 14 is molded at least on the first side surface 300, the first glue layer 13 on the first step surface 400, and the second side surface 500 through an injection molding process.

In this way, in the first aspect, because the plastic edge portion 14 is molded on the first side surface 300, the first glue layer 13 on the first step surface 400, and the second side surface 500 through an injection molding process, an outer surface of the plastic edge portion 14 can be continuously connected to the outer surface of the glass cover plate 11, thereby ensuring the appearance delicacy of the cover body structure 1. In the second aspect, both the first step surface 400 and the outer surface 100 face the side that is of the plane on which the outer surface 100 is located and that is away from the plane on which the inner surface 200 is located, the first ink layer 12 is disposed on the first step surface 400, and the first glue layer 13 is disposed on the first ink layer 12 on the first step surface 400, thereby facilitating the arrangement of the first ink layer 12 and the first glue layer 13 on the edge of the glass cover plate 11. In the third aspect, because the plastic edge portion 14 is molded on the first side surface 300 on the edge of the glass cover plate 11, the first glue layer 13 on the first step surface 400, and the second side surface 500 through an injection molding process, the plastic edge portion 14 can form an inward buckling structure. When the cover body structure 1 is applied to a housing of the electronic device, the plastic edge portion 14 can apply a force directed to an inner side of the glass cover plate 11 (that is, a side that is of a plane on which the inner surface 200 is located and that is away from a plane on which the outer surface 100 is located) to the glass cover plate 11, to prevent the glass cover plate 11 from falling off the plastic edge portion 14.

In the foregoing embodiment, an edge of the first side surface 300 close to the inner surface 200 may be connected to the edge circumference of the inner surface 200, or may be separated from at least a part of an edge of the inner surface 200 by using a middle surface. This is not specifically limited herein. Specifically, a connection form between the first side surface 300 and the inner surface 200 and disposition positions of the first ink layer 12, the first glue layer 13, and the plastic edge portion 14 may include the following first implementation to third implementation.

The first implementation: Still referring to FIG. 2a, the edge of the first side surface 300 close to the inner surface 200 is directly connected to the edge circumference of the inner surface 200.

Figure 2B:
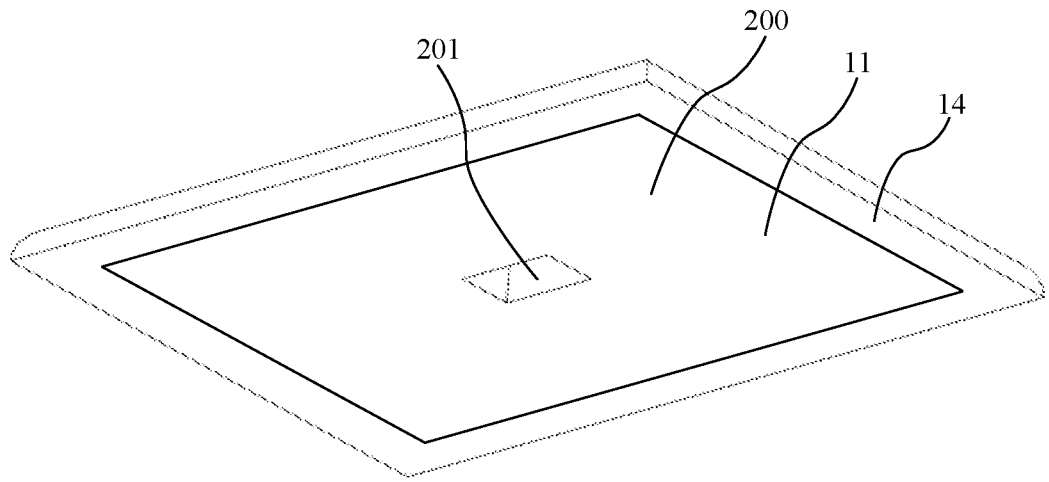
FIG. 2b is a three-dimensional view of a cover body structure according to some other embodiments of this application.

On this basis, to fix the glass cover plate 11 provided with the first ink layer 12 and the first glue layer 13 to a preset position on an injection molding machine before the plastic edge portion 14 is injection molded, in some embodiments, referring to FIG. 2b being a three-dimensional view of the cover body structure 1 according to some other embodiments of this application, a central region of the inner surface 200 of the glass cover plate 11 is provided with at least one positioning groove 201. The at least one positioning groove 201 is used for cooperating with positioning posts on the injection molding machine to fix the glass cover plate 11 provided with the first ink layer 12 and the first glue layer 13 to the preset position on the injection molding machine, to facilitate a subsequent operation of molding the plastic edge portion 14 on the edge of the glass cover plate 11.

The positioning groove 201 may be a through groove that passes through the glass cover plate 11 or a groove that does not passes through the glass cover plate 11. This is not specifically limited herein.

The positioning groove 201 may be a rectangular groove, a square groove, a triangular groove, a circular groove, a kidney-shaped groove, or the like. FIG. 2b only shows an example in which the positioning groove 201 is a rectangular groove. This cannot be considered as a special limitation on this application.

There may be one or more positioning grooves 201. FIG. 2b only shows an example in which there is one positioning groove 201. This cannot be considered as a special limitation on this application.

It should be noted that, when the positioning groove 201 is a circular groove, to position the glass cover plate 11, a plurality of positioning grooves 201 are needed.

In addition, it should be noted that, when the positioning groove 201 is a through groove passing through the glass cover plate 11, after the plastic edge portion 14 is molded on the edge of the glass cover plate 11, the positioning groove 201 needs to be filled with a transparent material to ensure the appearance of the glass cover plate 11.

Figure 3:
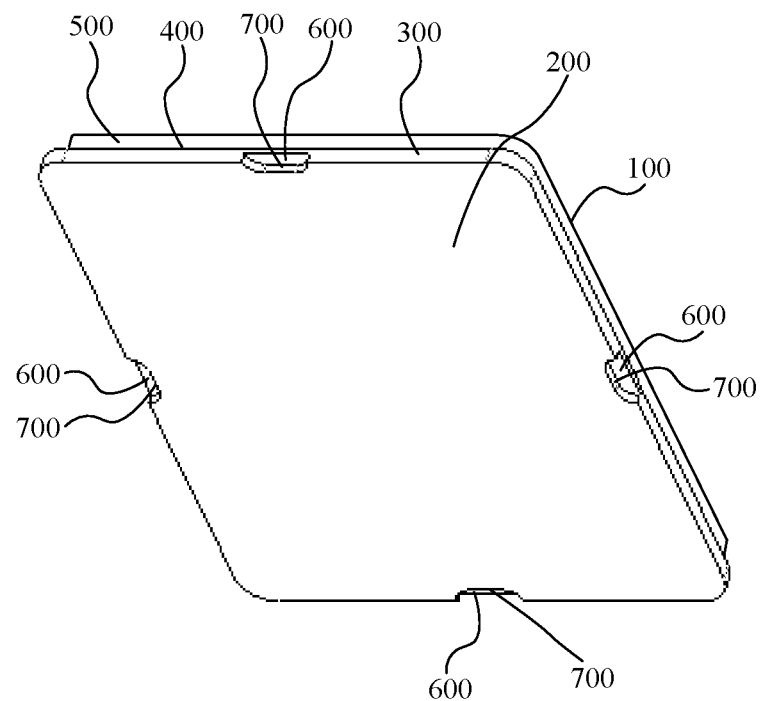
FIG. 3 is a three-dimensional view of a glass cover plate in a cover body structure according to some embodiments of this application.

The second implementation: The edge of the first side surface 300 close to the inner surface 200 is separated from at least a part of the edge of the inner surface 200 by using a middle surface. Specifically, FIG. 3 is a three-dimensional view of the glass cover plate 11 in the cover body structure 1 according to some embodiments of this application. The glass cover plate 11 further includes a second step surface 600 and a third side surface 700.

In some embodiments, the second step surface 600 and the third side surface 700 are processed and molded by using a milling cutter on a computer numerical control (computer numerical control, CNC) machine tool.

The second step surface 600 is located outside an edge of the inner surface 200. That is, the second step surface 600 is located on a side of the edge of the inner surface 200 away from a center of the inner surface 200.

The second step surface 600 may be a relatively small surface located outside one side edge of the inner surface 200, or may be a relatively large annular surface disposed around an edge circumference of the inner surface 200. This is not specifically limited herein. In the embodiment shown in FIG. 3, the second step surface 600 is a relatively small surface located outside one side edge of the inner surface 200. This cannot be considered as a special limitation on this application.

Figure 7:
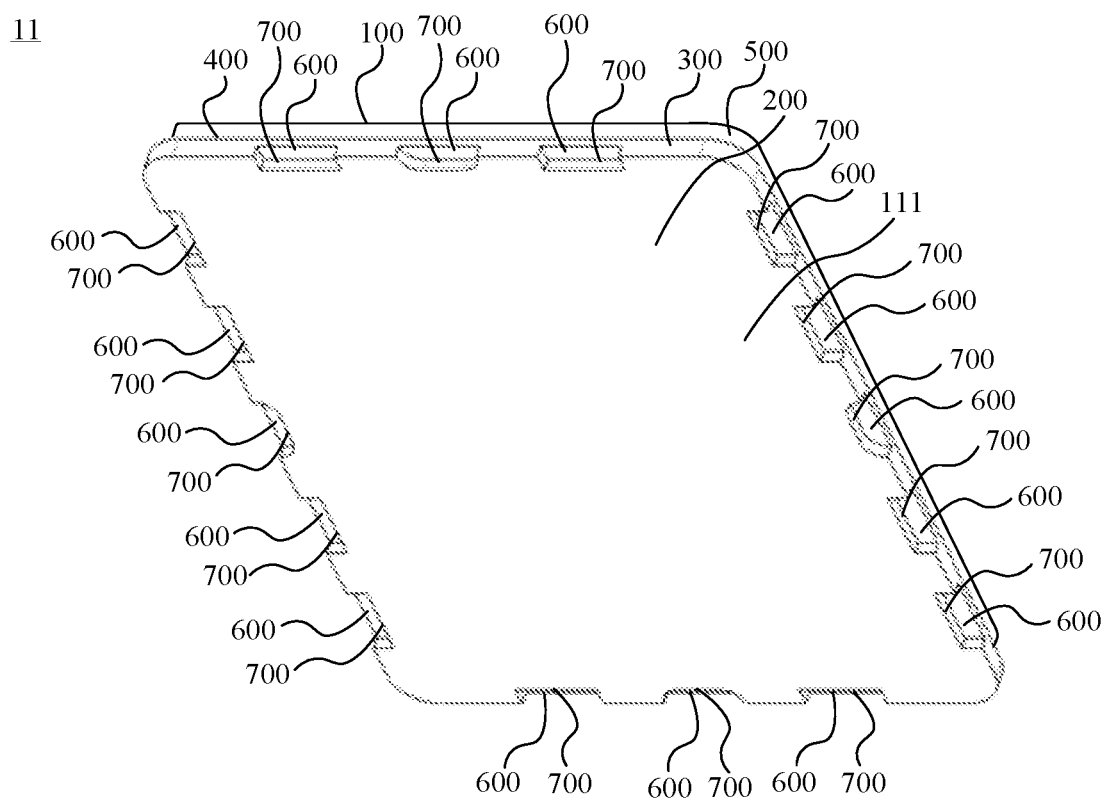
FIG. 7 is a three-dimensional view of a glass cover plate in a cover body structure according to some other embodiments of this application.

When the second step surface 600 is a relatively small surface located outside one side edge of the inner surface 200, there may be one or more second step surfaces 600. This is not specifically limited herein. When there are a plurality of second step surfaces 600, the plurality of second step surfaces 600 are arranged along the edge of the inner surface 200. Specifically, a quantity of the plurality of second step surfaces 600 may be 3, 4, 5, 8, 10, 16, or the like. This is not specifically limited herein. FIG. 3 only shows an example in which there are four second step surfaces 600. This cannot be considered as a special limitation on this application. In some other embodiments, FIG. 7 is a three-dimensional view of the glass cover plate 11 in the cover body structure 1 according to some other embodiments of this application. The quantity of the plurality of second step surfaces 600 is 16.

Both the second step surface 600 and the inner surface 200 face a side that is of a plane on which the inner surface 200 is located and that is away from a plane on which the outer surface 100 is located. In other words, that is, if a part of space located on the side that is of the plane on which the inner surface 200 is located and that is away from the plane on which the outer surface 100 is located is defined as an inner side space of the glass cover plate 11, the second step surface 600 and the inner surface 200 are both opposite to the inner side space of the glass cover plate 11.

The second step surface 600 has an outer edge disposed away from the center of the inner surface 200 and an inner edge disposed close to the center of the inner surface 200. The outer edge of the second step surface 600 is connected to the edge of the first side surface 300 close to the inner surface 200. The third side surface 700 is connected between the inner edge of the second step surface 600 and the inner surface 200. A distance from the second step surface 600 to the outer surface 100 is less than a distance from the inner surface 200 to the outer surface 100. That is, a distance from each part of the second step surface 600 to the outer surface 100 is less than the distance from the inner surface 200 to the outer surface 100.

When the second step surface 600 is an annular surface disposed around the edge circumference of the inner surface 200, the third side surface 700 is also an annular surface disposed around the edge circumference of the inner surface 200.

When the second step surface 600 is a relatively small surface located outside one side edge of the inner surface 200, and there are a plurality of second step surfaces 600, outer edges of the plurality of second step surfaces 600 are all connected to the first side surface 300. Correspondingly, there are also a plurality of third side surfaces 700, a quantity of the plurality of third side surfaces 700 is equal to a quantity of the plurality of second step surfaces 600, the plurality of third side surfaces 700 are in a one-to-one correspondence to the plurality of second step surfaces 600, and each third side surface 700 is connected between an inner edge of the second step surface 600 corresponding to the third side surface 700 and the inner surface 200. In the embodiment shown in FIG. 3, there are four second step surfaces 600, and there are also four third side surfaces 700. In the embodiment shown in FIG. 7, there are 16 second step surfaces 600, and there are also 16 third side surfaces 700. A groove enclosed by the second step surface 600 and the third side surface 700 corresponding to the second step surface 600 includes, but is not limited to, a rectangular groove, a square groove, a semicircular groove, and a dovetail groove. This is not specifically limited herein.

The second step surface 600 may be a plane or a curved surface. This is not specifically limited herein. When the second step surface 600 is a plane, the second step surface 600 may be parallel to the inner surface 200 (or the outer surface 100), or may tilt relative to the inner surface 200 (or the outer surface 100). This is not specifically limited herein.

The third side surface 700 may be a plane or a curved surface. This is not specifically limited herein. The third side surface 700 may be perpendicular to the inner surface 200 (or the outer surface 100), or may tilt relative to the inner surface 200 (or the outer surface 100). This is not specifically limited herein.

The plastic edge portion 14 is further molded on the second step surface 600 and the third side surface 700 through an injection molding process.

In this way, on the one hand, a bonding area between the plastic edge portion 14 and the glass cover plate 11 can be increased by using the second step surface 600 and the third side surface 700, thereby further increasing a bonding force between the plastic edge portion 14 and the glass cover plate 11 and improving the structural strength of the cover body structure 1. On the other hand, the second step surface 600 and the third side surface 700 may further cooperate with positioning posts to position the glass cover plate 11 on the injection molding machine.

When the second step surface 600 is a relatively small surface located outside one side edge of the inner surface 200, and there are a plurality of second step surfaces 600 and a plurality of third side surfaces 700, to enable the second step surfaces 600 and the third side surfaces 700 to cooperate with positioning posts on the injection molding machine to position the glass cover plate 11, in some embodiments, the plurality of second step surfaces 600 include at least three second step surfaces 600 arranged evenly around the edge circumference of the inner surface 200. In this way, the glass cover plate 11 can be fixed, by respectively attaching top surfaces of at least three positioning posts on the injection molding machine to the at least three second step surfaces 600 and respectively attaching side surfaces of the at least three positioning posts to third side surfaces 700 connected to the at least three second step surfaces 600, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement. The shape of the positioning post on the injection molding machine is not limited to cylindrical, rectangular, or other regular or irregular profiling structures.

It should be noted that in the foregoing embodiment, when the shape of the glass cover plate 11 is a circular flat plate shape, the glass cover plate 11 can be positioned by using three positioning posts and one ejector rod. When the shape of the glass cover plate 11 is a square flat plate shape or a rectangular flat plate shape, the glass cover plate 11 can be positioned only if four positioning posts and one ejector rod are used.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface 100 and the inner surface 200 of the glass cover plate 11 by using a structure such as a vacuum sucker or ebonite. This is not specifically limited herein.

Figure 4:
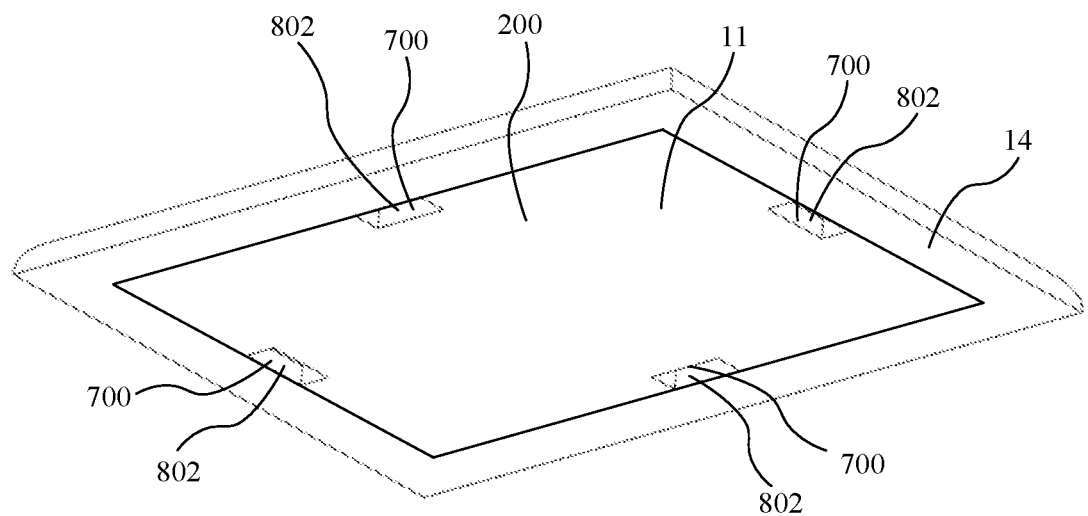
FIG. 4 is a three-dimensional view of a cover body structure obtained after a plastic edge portion is molded on an edge of the glass cover plate shown in FIG. 3 when the glass cover plate is positioned by using at least three positioning posts and one ejector rod.
Figure 5:
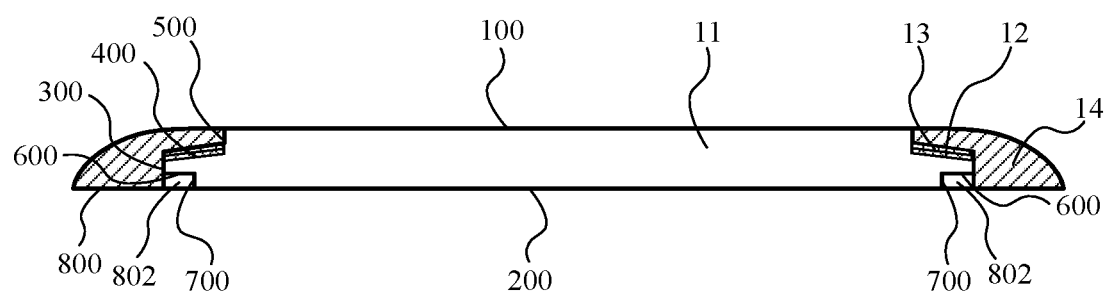
FIG. 5 is a cross-sectional view of the cover body structure shown in FIG. 4.

FIG. 4 is a three-dimensional view of a cover body structure 1 obtained after the plastic edge portion 14 is molded on the edge of the glass cover plate 11 shown in FIG. 3 when the glass cover plate 11 is positioned by using at least three positioning posts and one ejector rod. The plastic edge portion 14 has an inner surface 800. The inner surface 800 of the plastic edge portion 14 refers to a surface of the plastic edge portion 14 facing the inside of the electronic device when the cover body structure 1 is used as a part of the housing of the electronic device. Positions on the inner surface 800 of the plastic edge portion 14 that correspond to the at least three second step surfaces 600 are provided with second positioning post pull-out holes 802. FIG. 5 is a cross-sectional view of the cover body structure 11 shown in FIG. 4. The second positioning post pull-out hole 802 extends along a direction perpendicular to the glass cover plate 11, and the second step surface 600 and the third side surface 700 connected to the second step surface 600 form a partial inner surface region of the second positioning post pull-out hole 802.

Figure 6:
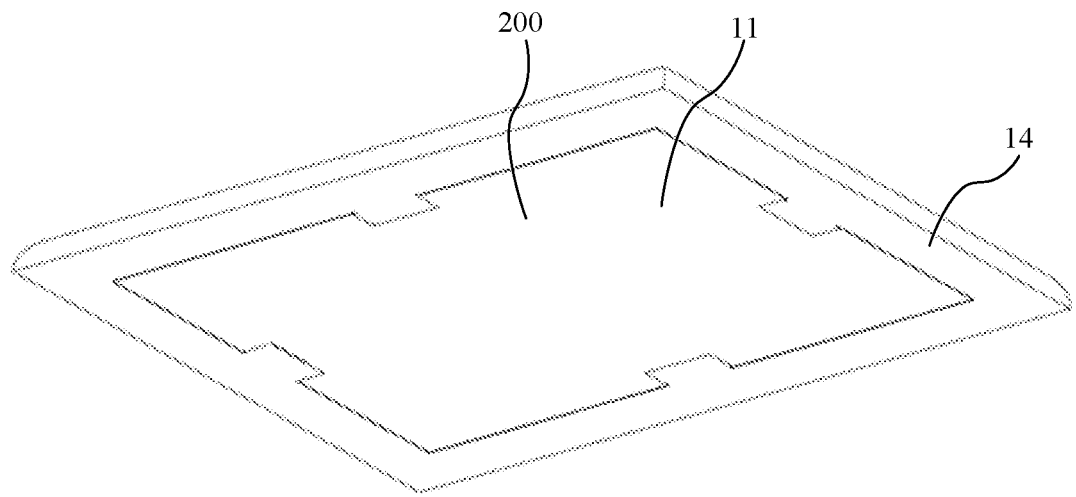
FIG. 6 is a three-dimensional view of a cover body structure obtained after a plastic edge portion is molded on an edge of the glass cover plate shown in FIG. 3 when the glass cover plate is positioned by using at least three positioning posts and one ejector rod and then the glass cover plate is switched to be clamped by an outer surface and an inner surface of the glass cover plate by using a structure such as a vacuum sucker or ebonite.

FIG. 6 is a three-dimensional view of a cover body structure 1 obtained after the plastic edge portion 14 is molded on the edge of the glass cover plate 11 shown in FIG. 3 when the glass cover plate 11 is positioned by using at least three positioning posts and one ejector rod and then the glass cover plate 11 is switched to be clamped by the outer surface 100 and the inner surface 200 of the glass cover plate 11 by using a structure such as a vacuum sucker or ebonite. When the plastic edge portion 14 is switched to a state in which the glass cover plate 11 is clamped by the outer surface 100 and the inner surface 200 of the glass cover plate 11 by using a structure such as a vacuum sucker or ebonite, the positioning of the glass cover plate 11 by using the at least three positioning posts and the ejector rod is canceled. In this way, no positioning post pull-out hole exists on the inner surface 800 of the plastic edge portion 14 in the molded cover body structure 1, thereby ensuring the surface integrity and structural strength of the cover body structure 1.

When the second step surface 600 is an annular surface disposed around the edge circumference of the inner surface 200, and the third side surface 700 is also an annular surface disposed around the edge circumference of the inner surface 200, to enable the second step surface 600 and the third side surface 700 to cooperate with positioning posts on the injection molding machine to position the glass cover plate 11, in some embodiments, the second step surface 600 includes at least three step surface regions arranged evenly around the edge circumference of the inner surface 200. In this way, the glass cover plate 11 can be fixed, by respectively attaching top surfaces of at least three positioning posts on the injection molding machine to the at least three step surface regions and respectively attaching side surfaces of the at least three positioning posts to partial regions of third side surfaces connected to the at least three step surface regions, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface and the inner surface of the glass cover plate 11 by using a structure such as a vacuum sucker or ebonite. This is not specifically limited herein.

In the cover body structure 1 obtained after the plastic edge portion 14 is molded on the edge of the glass cover plate 11 when the glass cover plate 11 is in a state of being positioned by using the at least three positioning posts and the ejector rod, positions on the inner surface of the plastic edge portion 14 that correspond to the at least three step surface regions are provided with second positioning post pull-out holes. The second positioning post pull-out hole extends along a direction perpendicular to the glass cover plate 11, and the step surface region and a partial region of the third side surface connected to the step surface region form a partial inner surface region of the second positioning post pull-out hole.

In the cover body structure 1 obtained after the plastic edge portion 14 is molded on the edge of the glass cover plate 11 when the glass cover plate 11 is positioned by using the at least three positioning posts and the ejector rod and then the glass cover plate 11 is switched to be clamped by the outer surface and the inner surface of the glass cover plate 11 by using a structure such as a vacuum sucker or ebonite, no positioning post pull-out hole exists on the inner surface 800 of the plastic edge portion 14, thereby ensuring the surface integrity and structural strength of the cover body structure 1.

Figure 8:
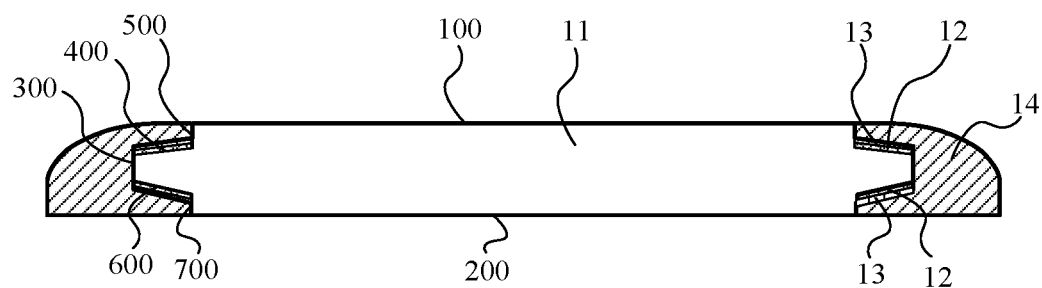
FIG. 8 is a schematic cross-sectional structural diagram of a cover body structure according to some other embodiments of this application.

The third implementation: The edge of the first side surface 300 close to the inner surface 200 is separated from at least a part of the edge of the inner surface 200 by using a middle surface. Specifically, FIG. 8 is a schematic cross-sectional structural diagram of a cover body structure 1 according to some other embodiments of this application. The glass cover plate 11 further includes a second step surface 600 and a third side surface 700.

In some embodiments, the second step surface 600 and the third side surface 700 are processed and molded by using a milling cutter on a computer numerical control (computer numerical control, CNC) machine tool.

The second step surface 600 is located outside an edge of the inner surface 200. That is, the second step surface 600 is located on a side of the edge of the inner surface 200 away from a center of the inner surface 200.

The second step surface 600 may be a relatively small surface located outside one side edge of the inner surface 200, or may be a relatively large annular surface disposed around an edge circumference of the inner surface 200. This is not specifically limited herein.

When the second step surface 600 is a relatively small surface located outside one side edge of the inner surface 200, there may be one or more second step surfaces 600. This is not specifically limited herein. When there are a plurality of second step surfaces 600, the plurality of second step surfaces 600 are arranged along the edge of the inner surface 200.

In the embodiment shown in FIG. 8, the second step surface 600 is an annular surface disposed around the edge circumference of the inner surface 200. This cannot be considered as a special limitation on this application.

Both the second step surface 600 and the inner surface 200 face a side that is of a plane on which the inner surface 200 is located and that is away from a plane on which the outer surface 100 is located. In other words, that is, if a part of space located on the side that is of the plane on which the inner surface 200 is located and that is away from the plane on which the outer surface 100 is located is defined as an inner side space of the glass cover plate 11, the second step surface 600 and the inner surface 200 are both opposite to the inner side space of the glass cover plate 11.

The second step surface 600 has an outer edge disposed away from the center of the inner surface 200 and an inner edge disposed close to the center of the inner surface 200. The outer edge of the second step surface 600 is connected to the edge of the first side surface 300 close to the inner surface 200. The third side surface 700 is connected between the inner edge of the second step surface 600 and the inner surface 200. A distance from the second step surface 600 to the outer surface 100 is less than a distance from the inner surface 200 to the outer surface 100. That is, a distance from each part of the second step surface 600 to the outer surface 100 is less than the distance from the inner surface 200 to the outer surface 100.

When the second step surface 600 is a relatively small surface located outside one side edge of the inner surface 200, and there are a plurality of second step surfaces 600, outer edges of the plurality of second step surfaces 600 are all connected to the first side surface 300. Correspondingly, there are also a plurality of third side surfaces 700, a quantity of the plurality of third side surfaces 700 is equal to a quantity of the plurality of second step surfaces 600, the plurality of third side surfaces 700 are in a one-to-one correspondence to the plurality of second step surfaces 600, and each third side surface 700 is connected between an inner edge of the second step surface 600 corresponding to the third side surface 700 and the inner surface 200.

When the second step surface 600 is an annular surface disposed around the edge circumference of the inner surface 200, the third side surface 700 is also an annular surface disposed around the edge circumference of the inner surface 200.

The second step surface 600 may be a plane or a curved surface. This is not specifically limited herein. When the second step surface 600 is a plane, the second step surface 600 may be parallel to the inner surface 200 (or the outer surface 100), or may tilt relative to the inner surface 200 (or the outer surface 100). This is not specifically limited herein.

The third side surface 700 may be a plane or a curved surface. This is not specifically limited herein. The third side surface 700 may be perpendicular to the inner surface 200 (or the outer surface 100), or may tilt relative to the inner surface 200 (or the outer surface 100). This is not specifically limited herein.

The first ink layer 12 is further disposed on the second step surface 600, the first glue layer 13 is further disposed on the first ink layer 12 on the second step surface 600, and the plastic edge portion 14 is further molded on the first glue layer 13 on the second step surface 600 and the third side surface 700 through an injection molding process.

In this way, on the one hand, a bonding area between the plastic edge portion 14 and the glass cover plate 11 can be increased by using the second step surface 600 and the third side surface 700, and a bonding force between the plastic edge portion 14 and the second step surface 600 in a unit area can be also increased by using the first ink layer 12 and the first glue layer 13 that are on the second step surface 600, thereby further increasing a bonding force between the plastic edge portion 14 and the glass cover plate 11 and improving the structural strength of the cover body structure 1. On the other hand, the second step surface 600 and the third side surface 700 may further cooperate with positioning posts to position the glass cover plate 11 on the injection molding machine.

When the second step surface 600 is a relatively small surface located outside one side edge of the inner surface 200, and there are a plurality of second step surfaces 600 and a plurality of third side surfaces 700, to enable the second step surfaces 600 and the third side surfaces 700 to cooperate with positioning posts on the injection molding machine to position the glass cover plate 11, in some embodiments, the plurality of second step surfaces 600 include at least three second step surfaces 600 arranged evenly around the edge circumference of the inner surface 200. In this way, the glass cover plate 11 can be fixed, by respectively attaching top surfaces of at least three positioning posts on the injection molding machine to surfaces of the first glue layers 13 on the at least three second step surfaces 600 and respectively attaching side surfaces of the at least three positioning posts to third side surfaces 700 connected to the at least three second step surfaces 600, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface 100 and the inner surface 200 of the glass cover plate 11 by using a structure such as a vacuum sucker or ebonite. This is not specifically limited herein.

In the cover body structure 1 obtained after the plastic edge portion 14 is molded on the edge of the glass cover plate 11 when the glass cover plate 11 is in a state of being positioned by using the at least three positioning posts and the ejector rod, positions on the inner surface 800 of the plastic edge portion 14 that correspond to the at least three second step surfaces 600 are provided with second positioning post pull-out holes. The second positioning post pull-out hole extends along a direction perpendicular to the glass cover plate 11, and the surface of the first glue layer 13 on the second step surface 600 and the third side surface 700 connected to the second step surface 600 form a partial inner surface region of the second positioning post pull-out hole.

In the cover body structure 1 obtained after the plastic edge portion 14 is molded on the edge of the glass cover plate 11 when the glass cover plate 11 is positioned by using the at least three positioning posts and the ejector rod and then the glass cover plate 11 is switched to be clamped by the outer surface 100 and the inner surface 200 of the glass cover plate 11 by using a structure such as a vacuum sucker or ebonite, no positioning post pull-out hole exists on the inner surface 800 of the plastic edge portion 14, thereby ensuring the surface integrity and structural strength of the cover body structure 1.

When the second step surface 600 is an annular surface disposed around the edge circumference of the inner surface 200, and the third side surface 700 is also an annular surface disposed around the edge circumference of the inner surface 200, to enable the second step surface 600 and the third side surface 700 to cooperate with positioning posts on the injection molding machine to position the glass cover plate 11, in some embodiments, the second step surface 600 includes at least three step surface regions arranged evenly around the edge circumference of the inner surface 200. In this way, the glass cover plate 11 can be fixed, by respectively attaching top surfaces of at least three positioning posts on the injection molding machine to surfaces of the first glue layers 13 on the at least three step surface regions and respectively attaching side surfaces of the at least three positioning posts to partial regions of third side surfaces connected to the at least three step surface regions, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface and the inner surface of the glass cover plate 11 by using a structure such as a vacuum sucker or ebonite. This is not specifically limited herein.

Figure 9:
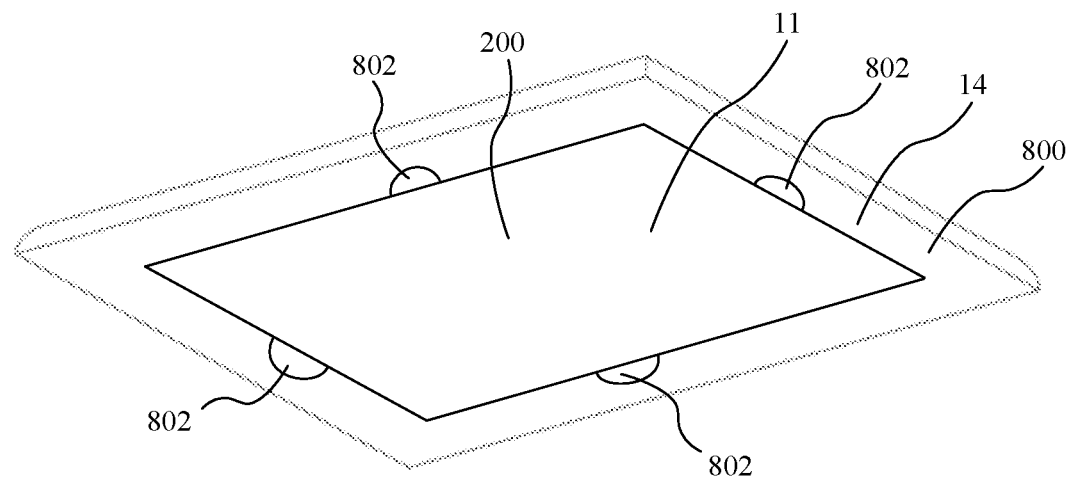
FIG. 9 is a three-dimensional view of a cover body structure obtained after a plastic edge portion is molded on an edge of a glass cover plate in the cover body structure shown in FIG. 8 when the glass cover plate is positioned by using at least three positioning posts and one ejector rod.

FIG. 9 is a three-dimensional view of a cover body structure 1 obtained after the plastic edge portion 14 is molded on the edge of the glass cover plate 11 in the cover body structure 1 shown in FIG. 8 when the glass cover plate 11 is positioned by using at least three positioning posts and one ejector rod. Positions on the inner surface 800 of the plastic edge portion 14 that correspond to the at least three step surface regions are provided with second positioning post pull-out holes 802. The second positioning post pull-out hole 802 extends along a direction perpendicular to the glass cover plate 11, and the surface of the first glue layer 13 on the step surface region and a partial region of the third side surface connected to the step surface region form a partial inner surface region of the second positioning post pull-out hole 802.

Figure 10:
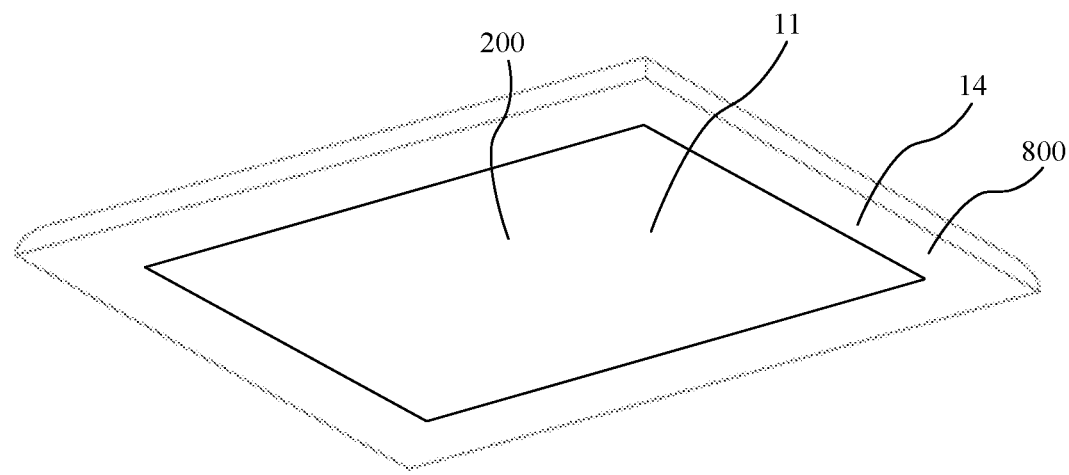
FIG. 10 is a three-dimensional view of a cover body structure obtained after a plastic edge portion is molded on an edge of a glass cover plate in the cover body structure shown in FIG. 8 when the glass cover plate is positioned by using at least three positioning posts and one ejector rod and then the glass cover plate is switched to be clamped by an outer surface and an inner surface of the glass cover plate by using a structure such as a vacuum sucker or ebonite.

FIG. 10 is a three-dimensional view of a cover body structure 1 obtained after the plastic edge portion 14 is molded on the edge of the glass cover plate 11 in the cover body structure 1 shown in FIG. 8 when the glass cover plate 11 is positioned by using at least three positioning posts and one ejector rod and then the glass cover plate 11 is switched to be clamped by the outer surface and the inner surface of the glass cover plate 11 by using a structure such as a vacuum sucker or ebonite. No positioning post pull-out hole exists on the inner surface 800 of the plastic edge portion 14, thereby ensuring the surface integrity and structural strength of the cover body structure 1.

Figure 11:
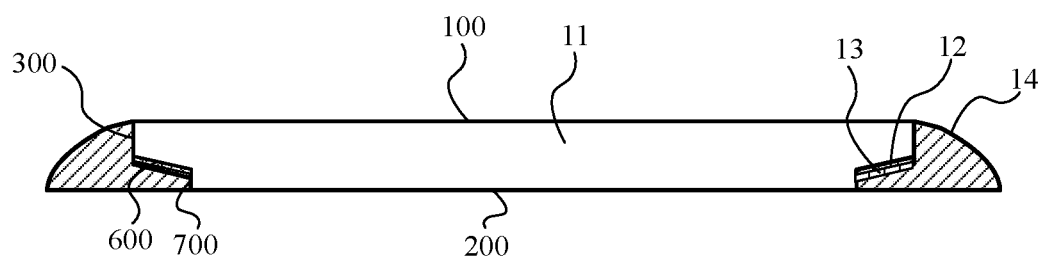
FIG. 11 is a schematic cross-sectional structural diagram of a cover body structure according to some other embodiments of this application.

Embodiment 2: FIG. 11 is a schematic cross-sectional structural diagram of a cover body structure 1 according to some other embodiments of this application. The edge of the first side surface 300 close to the outer surface 100 is connected to the edge circumference of the outer surface 100. The glass cover plate 11 includes the outer surface 100, the inner surface 200, and the first side surface 300 located between the edge circumference of the outer surface 100 and the edge circumference of the inner surface 200. In addition, the glass cover plate 11 further includes a second step surface 600 and a third side surface 700.

In some embodiments, the second step surface 600 and the third side surface 700 are processed and molded by using a milling cutter on a computer numerical control (computer numerical control, CNC) machine tool.

The second step surface 600 is located outside an edge of the inner surface 200. That is, the second step surface 600 is located on a side of the edge of the inner surface 200 away from a center of the inner surface 200.

The second step surface 600 may be a relatively small surface located outside one side edge of the inner surface 200, or may be a relatively large annular surface disposed around an edge circumference of the inner surface 200. This is not specifically limited herein.

When the second step surface 600 is a relatively small surface located outside one side edge of the inner surface 200, there may be one or more second step surfaces 600. This is not specifically limited herein. When there are a plurality of second step surfaces 600, the plurality of second step surfaces 600 are arranged along the edge of the inner surface 200.

In the embodiment shown in FIG. 11, the second step surface 600 is an annular surface disposed around the edge circumference of the inner surface 200. This cannot be considered as a special limitation on this application.

Both the second step surface 600 and the inner surface 200 face a side that is of a plane on which the inner surface 200 is located and that is away from a plane on which the outer surface 100 is located. In other words, that is, if a part of space located on the side that is of the plane on which the inner surface 200 is located and that is away from the plane on which the outer surface 100 is located is defined as an inner side space of the glass cover plate 11, the second step surface 600 and the inner surface 200 are both opposite to the inner side space of the glass cover plate 11.

The second step surface 600 has an outer edge disposed away from the center of the inner surface 200 and an inner edge disposed close to the center of the inner surface 200. The outer edge of the second step surface 600 is connected to the edge of the first side surface 300 close to the inner surface 200. The third side surface 700 is connected between the inner edge of the second step surface 600 and the inner surface 200. A distance from the second step surface 600 to the outer surface 100 is less than a distance from the inner surface 200 to the outer surface 100. That is, a distance from each part of the second step surface 600 to the outer surface 100 is less than the distance from the inner surface 200 to the outer surface 100.

When the second step surface 600 is a relatively small surface located outside one side edge of the inner surface 200, and there are a plurality of second step surfaces 600, outer edges of the plurality of second step surfaces 600 are all connected to the first side surface 300. Correspondingly, there are also a plurality of third side surfaces 700, a quantity of the plurality of third side surfaces 700 is equal to a quantity of the plurality of second step surfaces 600, the plurality of third side surfaces 700 are in a one-to-one correspondence to the plurality of second step surfaces 600, and each third side surface 700 is connected between an inner edge of the second step surface 600 corresponding to the third side surface 700 and the inner surface 200.

When the second step surface 600 is an annular surface disposed around the edge circumference of the inner surface 200, the third side surface 700 is also an annular surface disposed around the edge circumference of the inner surface 200.

The second step surface 600 may be a plane or a curved surface. This is not specifically limited herein. When the second step surface 600 is a plane, the second step surface 600 may be parallel to the inner surface 200 (or the outer surface 100), or may tilt relative to the inner surface 200 (or the outer surface 100). This is not specifically limited herein.

The third side surface 700 may be a plane or a curved surface. This is not specifically limited herein. The third side surface 700 may be perpendicular to the inner surface 200 (or the outer surface 100), or may tilt relative to the inner surface 200 (or the outer surface 100). This is not specifically limited herein.

The first ink layer 12 is disposed on the second step surface 600, the first glue layer 13 is disposed on the first ink layer 12 on the second step surface 600, and the plastic edge portion 14 is molded on the first side surface 300, the first glue layer 13 on the second step surface 600, and the third side surface 700 through an injection molding process.

In this way, in the first aspect, because the plastic edge portion 14 is molded on the first side surface 300, the first glue layer 13 on the second step surface 600, and the third side surface 700 through an injection molding process, an outer surface of the plastic edge portion 14 can be continuously connected to the outer surface of the glass cover plate 11, thereby ensuring the appearance delicacy of the cover body structure 1. In the second aspect, both the second step surface 600 and the inner surface 200 face a side that is of a plane on which the inner surface 200 is located and that is away from a plane on which the outer surface 100 is located, the first ink layer 12 is disposed on the second step surface 600, and the first glue layer 13 is disposed on the first ink layer 12 on the second step surface 600, thereby facilitating the arrangement of the first ink layer 12 and the first glue layer 13 on the edge of the glass cover plate 11. In the third aspect, the second step surface 600 and the third side surface 700 may further cooperate with positioning posts to position the glass cover plate 11 on the injection molding machine.

When the second step surface 600 is a relatively small surface located outside one side edge of the inner surface 200, and there are a plurality of second step surfaces 600 and a plurality of third side surfaces 700, to enable the second step surfaces 600 and the third side surfaces 700 to cooperate with positioning posts on the injection molding machine to position the glass cover plate 11, in some embodiments, the plurality of second step surfaces 600 include at least three second step surfaces 600 arranged evenly around the edge circumference of the inner surface 200. In this way, the glass cover plate 11 can be fixed, by respectively attaching top surfaces of at least three positioning posts on the injection molding machine to surfaces of the first glue layers 13 on the at least three second step surfaces 600 and respectively attaching side surfaces of the at least three positioning posts to third side surfaces 700 connected to the at least three second step surfaces 600, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface 100 and the inner surface 200 of the glass cover plate 11 by using a structure such as a vacuum sucker or ebonite. This is not specifically limited herein.

In the cover body structure 1 obtained after the plastic edge portion 14 is molded on the edge of the glass cover plate 11 when the glass cover plate 11 is in a state of being positioned by using the at least three positioning posts and the ejector rod, positions on the inner surface 800 of the plastic edge portion 14 that correspond to the at least three second step surfaces 600 are provided with second positioning post pull-out holes. The second positioning post pull-out hole extends along a direction perpendicular to the glass cover plate 11, and the surface of the first glue layer 13 on the second step surface 600 and the third side surface 700 connected to the second step surface 600 form a partial inner surface region of the second positioning post pull-out hole.

In the cover body structure 1 obtained after the plastic edge portion 14 is molded on the edge of the glass cover plate 11 when the glass cover plate 11 is positioned by using the at least three positioning posts and the ejector rod and then the glass cover plate 11 is switched to be clamped by the outer surface 100 and the inner surface 200 of the glass cover plate 11 by using a structure such as a vacuum sucker or ebonite, no positioning post pull-out hole exists on the inner surface 800 of the plastic edge portion 14, thereby ensuring the surface integrity and structural strength of the cover body structure 1.

When the second step surface 600 is an annular surface disposed around the edge circumference of the inner surface 200, and the third side surface 700 is also an annular surface disposed around the edge circumference of the inner surface 200, to enable the second step surface 600 and the third side surface 700 to cooperate with positioning posts on the injection molding machine to position the glass cover plate 11, in some embodiments, the second step surface 600 includes at least three step surface regions arranged evenly around the edge circumference of the inner surface 200. In this way, the glass cover plate 11 can be fixed, by respectively attaching top surfaces of at least three positioning posts on the injection molding machine to surfaces of the first glue layers 13 on the at least three step surface regions and respectively attaching side surfaces of the at least three positioning posts to partial regions of third side surfaces connected to the at least three step surface regions, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface and the inner surface of the glass cover plate 11 by using a structure such as a vacuum sucker or ebonite. This is not specifically limited herein.

In the cover body structure 1 obtained after the plastic edge portion 14 is molded on the edge of the glass cover plate 11 when the glass cover plate 11 is in a state of being positioned by using the at least three positioning posts and the ejector rod, positions on the inner surface 800 of the plastic edge portion 14 that correspond to the at least three step surface regions are provided with second positioning post pull-out holes. The second positioning post pull-out hole extends along a direction perpendicular to the glass cover plate 11, and the surface of the first glue layer 13 on the step surface region and a partial region of the third side surface connected to the step surface region form a partial inner surface region of the second positioning post pull-out hole.

In the cover body structure 1 obtained after the plastic edge portion 14 is molded on the edge of the glass cover plate 11 when the glass cover plate 11 is positioned by using the at least three positioning posts and the ejector rod and then the glass cover plate 11 is switched to be clamped by the outer surface and the inner surface of the glass cover plate 11 by using a structure such as a vacuum sucker or ebonite, no positioning post pull-out hole exists on the inner surface 800 of the plastic edge portion 14, thereby ensuring the surface integrity and structural strength of the cover body structure 1.

Figure 12:
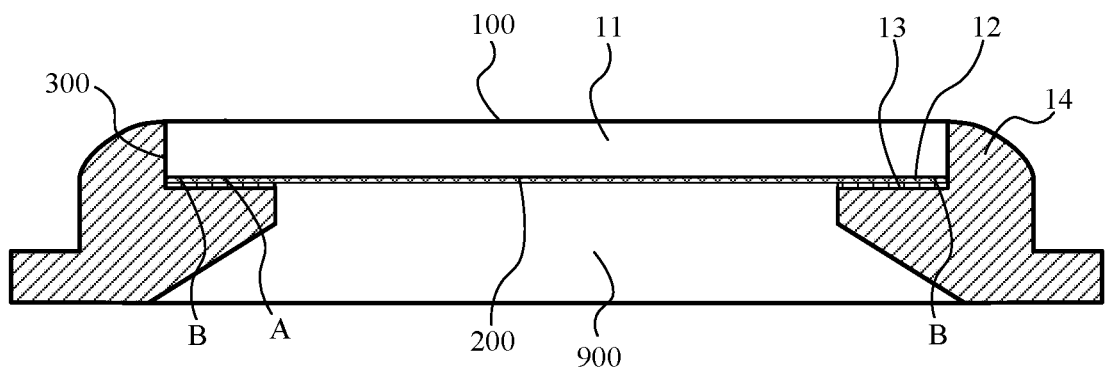
FIG. 12 is a schematic cross-sectional structural diagram of a cover body structure according to some other embodiments of this application.

Embodiment 3: FIG. 12 is a schematic cross-sectional structural diagram of a cover body structure 1 according to some other embodiments of this application. The edge of the first side surface 300 close to the outer surface 100 is connected to the edge circumference of the outer surface 100, and the edge of the first side surface 300 close to the inner surface 200 is connected to the edge circumference of the inner surface 200.

The inner surface 200 includes an edge region A. The edge region A may be a relatively small region located on one side edge of the inner surface 200 or a relatively large annular region located around the edge circumference of the inner surface 200. In the embodiment shown in FIG. 12, the edge region A is an annular region located around the edge circumference of the inner surface 200. This cannot be considered as a special limitation on this application.

The first ink layer 12 is disposed at least on the edge region A. That is, the first ink layer 12 may be disposed only on the edge region A or disposed on other regions in addition to the edge region A. This is not specifically limited herein.

In the embodiment shown in FIG. 12, the first ink layer 12 is disposed on the entire inner surface 200 including the edge region A. In this case, if the cover body structure 1 is used as a front cover plate of the electronic device and a decorative cover of the camera module, a transparent ink layer needs to be selected as the first ink layer 12. If the cover body structure 1 is used as a back cover of the electronic device, a light-proof ink layer such as a black ink layer, a color ink layer, or a white ink layer needs to be selected as the first ink layer 12, to hide a circuit structure in the electronic device.

In some other embodiments, the cover body structure 1 is used as a decorative cover of the camera module. The first ink layer 12 is disposed on regions on the inner surface 200 other than a light entering region. The light entering region is used for ensuring a light entering amount of the camera module. In this embodiment, a light-proof ink layer such as a black ink layer, a color ink layer, or a white ink layer may be selected as the first ink layer 12.

The first glue layer 13 is disposed on the first ink layer 12 on the edge region A. The plastic edge portion 14 is molded on the first side surface 300 and the first glue layer 13 on the edge region A through an injection molding process.

In this way, on the one hand, the integrity of the glass cover plate 11 can be ensured without processing a step surface on the glass cover plate 11. On the other hand, the first side surface 300 and the inner surface 200 can cooperate with the positioning posts on the injection molding machine to position the glass cover plate 11.

In the foregoing embodiment, to enable the first side surface 300 and the inner surface 200 to cooperate with the positioning posts on the injection molding machine to position the glass cover plate 11, in some embodiments, the inner surface 200 includes at least three positioning regions B arranged evenly around the edge circumference of the inner surface 200. In this way, the glass cover plate 11 can be fixed, by disposing step surfaces on edges of top surfaces of at least three positioning posts on the injection molding machine and side surfaces connected between the step surfaces and the top surfaces, attaching the step surfaces on the edges of the top surfaces of the at least three positioning posts to the at least three positioning regions B, and respectively attaching the side surfaces that are on the edges of the top surfaces of the at least three positioning posts and that are connected to the step surfaces to partial regions of the first side surface 300 connected to the at least three positioning regions B, to a position on a plane on which the glass cover plate is located. On this basis, an ejector rod is added on a side of the outer surface 100 of the glass cover plate 11 away from the inner surface 200, and a top surface of the ejector rod is attached to the outer surface 100 of the glass cover plate 11 to fix the glass cover plate 11 to a position on a plane perpendicular to the plane on which the glass cover plate is located, thereby realizing positioning. Such a positioning manner is simple and easy to implement.

The plastic edge portion 14 may be molded on the edge of the glass cover plate 11 when the glass cover plate 11 is in a state of being positioned by using the at least three positioning posts and the ejector rod, or may be molded on the edge of the glass cover plate 11 after the glass cover plate 11 is positioned by using the at least three positioning posts and the ejector rod and then the glass cover plate 11 is switched to be clamped by the outer surface 100 and the inner surface 200 of the glass cover plate 11 by using a structure such as a vacuum sucker or ebonite. This is not specifically limited herein.

Figure 13:
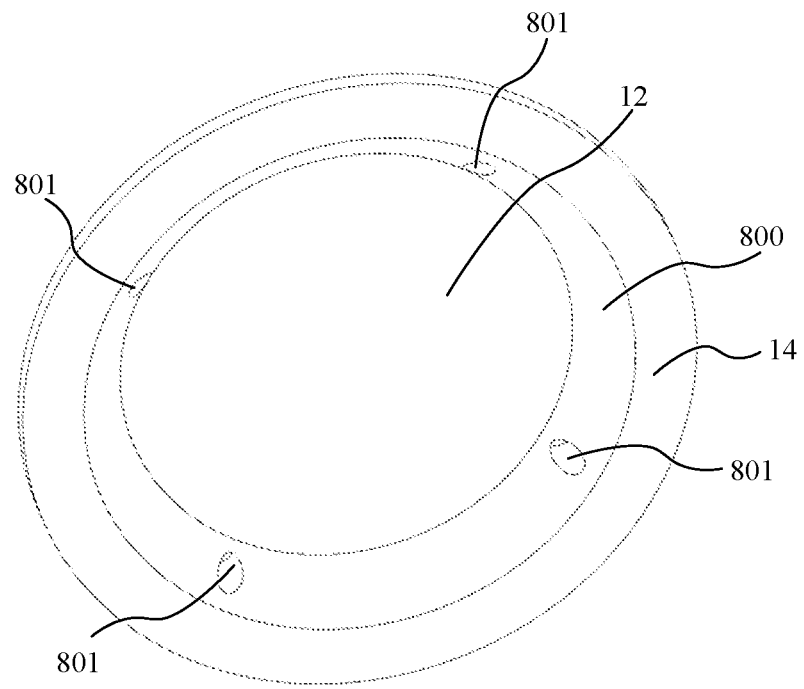
FIG. 13 is a three-dimensional view of a cover body structure obtained after a plastic edge portion is molded on an edge of a glass cover plate in the cover body structure shown in FIG. 12 when the glass cover plate is positioned by using at least three positioning posts and one ejector rod.
Figure 14:
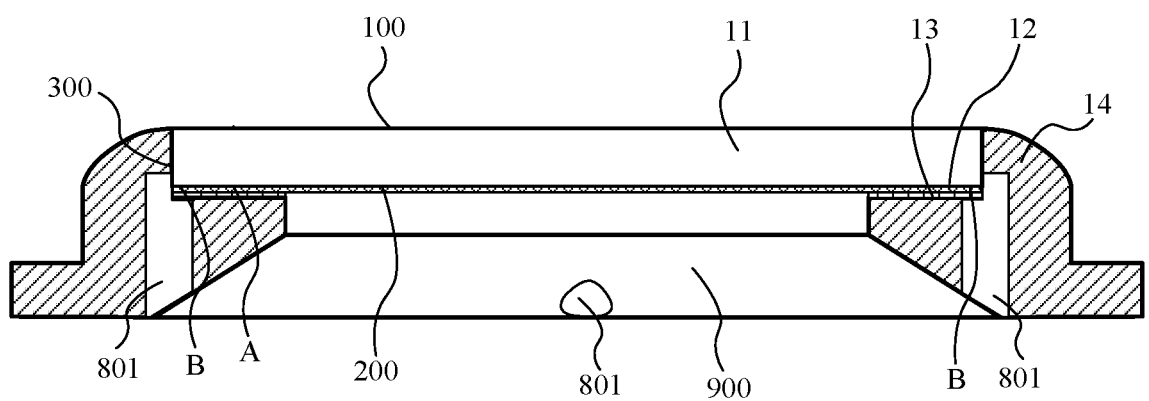
FIG. 14 is a schematic cross-sectional structural diagram of the cover body structure shown in FIG. 13.

FIG. 13 is a three-dimensional view of a cover body structure 1 obtained after the plastic edge portion 14 is molded on the edge of the glass cover plate 11 in the cover body structure 1 shown in FIG. 12 when the glass cover plate 11 is positioned by using at least three positioning posts and one ejector rod. Positions on an inner surface 800 of the plastic edge portion 14 that correspond to the at least three positioning regions B are provided with first positioning post pull-out holes 801. FIG. 14 is a schematic cross-sectional structural diagram of the cover body structure 1 shown in FIG. 13. The first positioning post pull-out hole 801 extends along a direction perpendicular to the glass cover plate 11, and the surface of the first glue layer 13 on the positioning region B and a partial region of the first side surface 300 connected to the positioning region B form a partial inner surface region of the first positioning post pull-out hole 801.

Figure 15:
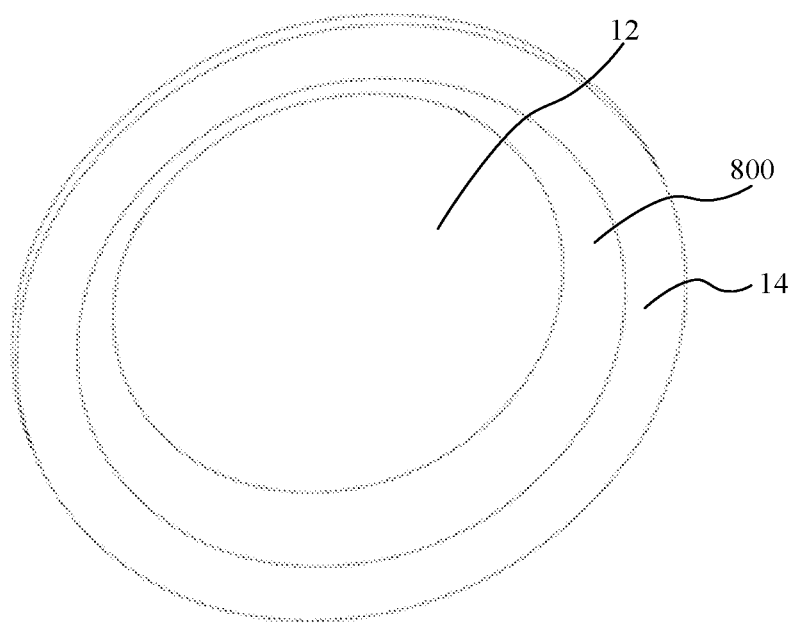
FIG. 15 is a three-dimensional view of a cover body structure obtained after a plastic edge portion is molded on an edge of a glass cover plate in the cover body structure shown in FIG. 12 when the glass cover plate is positioned by using at least three positioning posts and one ejector rod and then the glass cover plate is switched to be clamped by an outer surface and an inner surface of the glass cover plate by using a structure such as a vacuum sucker or ebonite.

FIG. 15 is a three-dimensional view of a cover body structure 1 obtained after the plastic edge portion 14 is molded on the edge of the glass cover plate 11 in the cover body structure 1 shown in FIG. 12 when the glass cover plate 11 is positioned by using at least three positioning posts and one ejector rod and then the glass cover plate 11 is switched to be clamped by the outer surface 100 and the inner surface 200 of the glass cover plate 11 by using a structure such as a vacuum sucker or ebonite. No positioning post pull-out hole exists on the inner surface 800 of the plastic edge portion 14, thereby ensuring the surface integrity and structural strength of the cover body structure 1.

In the cover body structure 1 shown in FIG. 12, a laser engraving surface or a step surface may be further disposed on the first side surface 300 of the glass cover plate 11 to increase a bonding area between the first side surface 300 and the plastic edge portion 14, thereby further increasing the bonding strength between the plastic edge portion 14 and the glass cover plate 11.

It should be noted that, in this embodiment of this application, an edge structure form of the glass cover plate 11 and disposition positions of the first ink layer 12, the first glue layer 13, and the plastic edge portion 14 are not limited to the foregoing embodiment 1, embodiment 2, and embodiment 3, and further include other feasible embodiments, as long as conditions that the first ink layer 12 is disposed at least on the edge of the glass cover plate 11, the first glue layer 13 is disposed on the first ink layer 12 on the edge of the glass cover plate 11, and the plastic edge portion 14 is molded at least on the first glue layer 13 on the edge of the glass cover plate 11 through an injection molding process are satisfied. This is not specifically limited herein.

Based on any one of the foregoing embodiments of the cover body structure 1, the cover body structure 1 can form the front cover plate 10 of the electronic device shown in FIG. 1a to FIG. 1c. In this case, the plastic edge portion 14 is configured to meet 2.5D or 3D appearance design requirements for one side edge, two side edges, three side edge, or an edge circumference of the front cover plate 10. For example, in the embodiments shown in FIG. 2a, FIG. 5, FIG. 8, and FIG. 11, the outer surface of the plastic edge portion 14 is a curved surface and the inner surface is a plane. The plastic edge portion 14 of such a structure can meet 2.5D appearance design requirements of edges of the front cover plate 10. The plastic edge portion 14 may also form the decorative cover 320 of the electronic device shown in FIG. 1a to FIG. 1c. In this case, the plastic edge portion 14 is disposed around the edge circumference of the glass cover plate 11, and an accommodating groove 900 is enclosed between the plastic edge portion 14 and the glass cover plate 11 on a side of the inner surface 200 away from the outer surface 100. The accommodating groove 900 is used for accommodating an object side end of the camera module 50.

Figure 16:
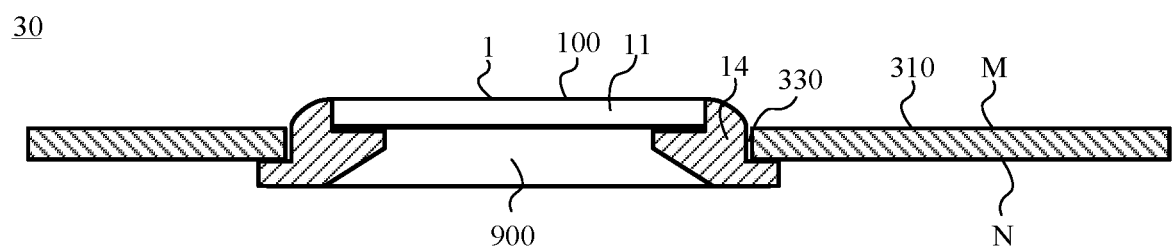
FIG. 16 is a schematic structural diagram of applying the cover body structure shown in FIG. 12 to a back cover in the electronic device shown in FIG. 1a to FIG. 1c.

When the cover body structure 1 is used as the decorative cover 320 of the electronic device shown in FIG. 1a to FIG. 1c, for example, referring to FIG. 16 being a schematic structural diagram of applying the cover body structure 1 shown in FIG. 12 to the back cover 30 in the electronic device shown in FIG. 1a to FIG. 1c, the back cover body 310 includes an outer surface M and an inner surface N, the outer surface M of the back cover body 310 refers to a surface of the back cover body 310 facing the outside of the electronic device when the back cover is applied to the electronic device, the inner surface N of the back cover body 310 refers to a surface of the back cover body 310 facing the inside of the electronic device when the back cover is applied to the electronic device, and the opening 330 passes through the outer surface M and the inner surface N.

An orientation of the outer surface 100 of the glass cover plate 11 of the cover body structure 1 is the same as an orientation of the outer surface M of the back cover body 310, and the plastic edge portion 14 of the cover body structure 1 is fixed to an edge circumference of the back cover body 310 at the opening 330.

In the back cover 30 provided in the foregoing embodiment, because the back cover 30 includes the cover body structure 1 used as the decorative cover of the camera module, and the bonding strength between the glass cover plate 11 of the cover body structure 1 and the plastic edge portion 14 is better, the structural strength and stability of the back cover 30 can be ensured.

In the foregoing embodiment, the plastic edge portion 14 of the cover body structure 1 may be fixed to an edge circumference of the back cover body 310 at the opening 330 through a process such as gluing, engagement, or threaded connection. This is not specifically limited herein.

Figure 17:
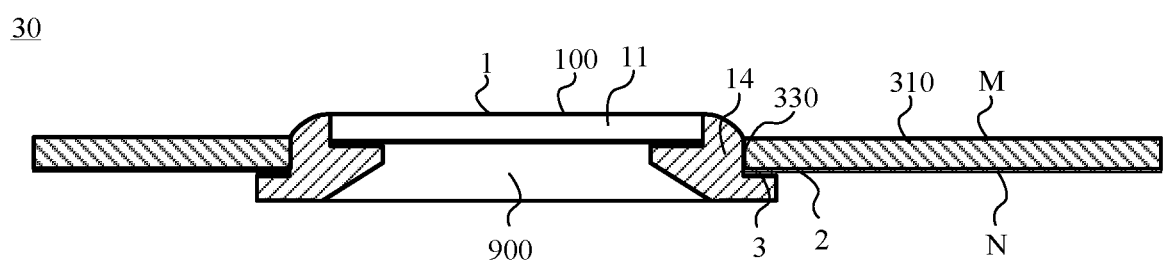
FIG. 17 is another schematic structural diagram of applying the cover body structure shown in FIG. 12 to a back cover in the electronic device shown in FIG. 1a to FIG. 1c.

In some embodiments, FIG. 17 is another schematic structural diagram of applying the cover body structure 1 shown in FIG. 12 to the back cover 30 in the electronic device shown in FIG. 1a to FIG. 1c. The back cover further includes a second ink layer 2 and a second glue layer 3.

The second ink layer 2 may be at least one of a black ink layer, a color ink layer, a white ink layer, or a transparent ink layer. This is not specifically limited herein.

The second ink layer 2 is disposed at least on an edge of the back cover body 310 at the opening 330. That is, the second ink layer 2 may be disposed on only the edge of the back cover body 310 at the opening 330, or the second ink layer 2 may be disposed on another region on the inner surface of the back cover body 310 in addition to the edge of the back cover body 310 at the opening 330.

A part of the second ink layer 2 disposed on the edge of the back cover body 310 at the opening 330 may be disposed on a partial region of the edge of the back cover body 310 at the opening 330, or may be disposed on an entire region of an edge circumference of the back cover body 310 at the opening 330. This is not specifically limited herein.

The second ink layer 2 may be disposed at least on the edge of the back cover body 310 at the opening 330 through at least one of a glass direct molding process, a silk screen printing process, or a pad printing process. This is not specifically limited herein.

The second glue layer 3 is disposed on the second ink layer 2 on the edge of the back cover body 310 at the opening 330. In some embodiments, the first glue layer 13 may be disposed on the second ink layer 2 on the edge of the back cover body 310 at the opening 330 through at least one of a blade coating process, a roll coating process, a dip coating process, or a spray coating process. This is not specifically limited herein.

The plastic edge portion 14 is further molded at least on the second glue layer 3 on the edge circumference of the back cover body 310 at the opening 330 through an injection molding process.

The second glue layer 3 is a glue layer viscous at least at an injection molding temperature of the plastic edge portion 14. In some embodiments, the material of the second glue layer 3 is the same as the material of the first glue layer 13.

The second ink layer 2 is an ink layer that can withstand the injection molding temperature of the plastic edge portion 14. In some embodiments, the material of the second ink layer 2 is the same as the material of the first ink layer 12.

In this way, the plastic edge portion 14 of the cover body structure 1 and the edge circumference of the back cover body 310 at the opening 330 can be molded into a whole through an injection molding process. The structure is simple with relatively high bonding strength while ensuring the appearance delicacy of the back cover.

This application further provides an electronic device. The electronic device may include, but is not limited to, a notebook computer, a tablet computer, a mobile phone, a watch, a pendant device or another wearable or micro device, a cellular phone, or a media player.

Figure 18:
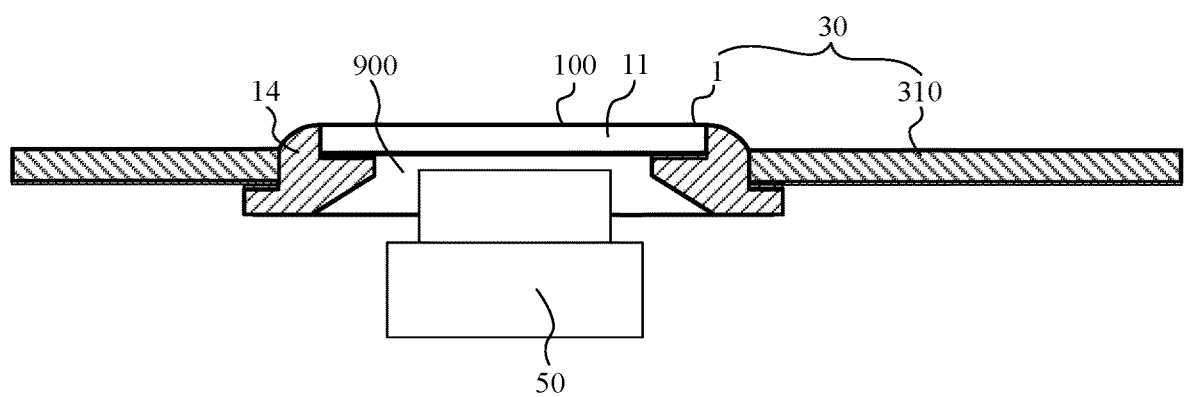
FIG. 18 is a schematic cross-sectional structural diagram of an electronic device according to some embodiments of this application.

FIG. 18 is a schematic cross-sectional structural diagram of an electronic device according to some embodiments of this application. The electronic device includes the cover body structure 1 described in any one of the foregoing embodiments and a camera module 50 or includes the back cover 30 described in any one of the foregoing embodiments and a camera module 50. FIG. 18 shows only a schematic cross-sectional structural diagram of an electronic device including the back cover 30 described in any one of the foregoing embodiments and a camera module 50. This cannot be considered as a special limitation on the structure of the electronic device. For example, the camera module 50 is a rear-facing camera module. The camera module 50 is disposed on an inner side of the cover body structure 1, and a light-incident surface of the camera module 50 faces a glass cover plate 11 of the cover body structure 1. The inner side of the cover body structure 1 refers to a side of the cover body structure 1 facing the inside of the electronic device when the cover body structure 1 is applied to the electronic device.

In the electronic device provided in the foregoing embodiment, because the electronic device includes the cover body structure 1 or the back cover 30 described in any one of the foregoing embodiments, the back cover 30 provided in any one of the foregoing embodiments includes the cover body structure 1 described in any one of the foregoing embodiments, and the structural strength and appearance delicacy of the cover body structure 1 are better, improvements in the structural strength and appearance delicacy of the electronic device are facilitated.

In the descriptions of this specification, the described specific features, structures, materials, or characteristics may be combined in a proper manner in any one or more of the embodiments or examples.

The foregoing embodiments are merely intended for describing the technical solutions of this application, but not for limiting this application. Although this application is described in detail with reference to the foregoing embodiments, a person of ordinary skill in the art is to understand that they may still make modifications to the technical solutions described in the foregoing embodiments or make equivalent replacements to some technical features thereof, without departing from the spirit and scope of the technical solutions of the embodiments of this application.

What is claimed is:

1. A cover body structure, comprising:
    a glass cover plate;
    a first ink layer, disposed at least on an edge of the glass cover plate;
    a first glue layer, disposed on the first ink layer on the edge of the glass cover plate; and
    a plastic edge portion, disposed on the first glue layer on the edge of the glass cover plate, wherein
    the first glue layer is a glue layer viscous at least at an injection molding temperature of the plastic edge portion, and the first ink layer is an ink layer that is able to withstand the injection molding temperature of the plastic edge portion.

2. The cover body structure according to claim 1, wherein the glass cover plate comprises an outer surface, an inner surface, and a first side surface located between an edge circumference of the outer surface and an edge circumference of the inner surface, the inner surface comprises an edge region, the first ink layer is disposed at least on the edge region, the first glue layer is disposed on the first ink layer on the edge region, the plastic edge portion is disposed on the first side surface and the first glue layer on the edge region, the plastic edge portion is disposed around an edge circumference of the glass cover plate, and the plastic edge portion and the glass cover plate enclose an accommodating groove on a side of the inner surface away from the outer surface.

3. The cover body structure according to claim 2, wherein an inner surface of the plastic edge portion is provided with at least three first positioning post pull-out holes, the at least three first positioning post pull-out holes are evenly arranged around the edge circumference of the glass cover plate, the first positioning post pull-out hole extends along a direction perpendicular to the glass cover plate, and a partial region of the edge region and a partial region of the first side surface form a partial inner surface region of the first positioning post pull-out hole.

4. The cover body structure according to claim 1, wherein the first glue layer is a thermally activated glue layer, activated in a first temperature range, and solidified in a second temperature range;
    the first temperature range comprises the injection molding temperature of the plastic edge portion; and
    a maximum temperature value of the second temperature range is less than a minimum temperature value of the first temperature range.

5. The cover body structure according to claim 1, wherein the glass cover plate comprises an outer surface, an inner surface, and a first side surface located between an edge circumference of the outer surface and an edge circumference of the inner surface, the glass cover plate further comprises a first step surface and a second side surface, the first step surface is located outside an edge of the outer surface, both the first step surface and the outer surface face a side that is of a plane on which the outer surface is located and that is away from a plane on which the inner surface is located, the first step surface has an outer edge away from a center of the outer surface and an inner edge close to the center of the outer surface, the outer edge of the first step surface is connected to an edge of the first side surface close to the outer surface, the second side surface is connected between the inner edge of the first step surface and the outer surface, and a distance from the first step surface to the inner surface is less than a distance from the outer surface to the inner surface; and
    the first ink layer is disposed at least on the first step surface, the first glue layer is disposed at least on the first ink layer on the first step surface, and the plastic edge portion is disposed on the first side surface, the first glue layer on the first step surface, and the second side surface.

6. The cover body structure according to claim 5, wherein an edge of the first side surface close to the inner surface is connected to the edge circumference of the inner surface.

7. The cover body structure according to claim 6, wherein a central region of the inner surface is provided with at least one positioning groove.

8. The cover body structure according to claim 5, wherein the glass cover plate further comprises a second step surface and a third side surface, the second step surface is located outside an edge of the inner surface, both the second step surface and the inner surface face a side that is of the plane on which the inner surface is located and that is away from the plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and
the plastic edge portion is further disposed on the second step surface and the third side surface.

9. The cover body structure according to claim 8, wherein there are a plurality of second step surfaces, the plurality of second step surfaces are arranged along the edge of the inner surface, and outer edges of the plurality of second step surfaces are all connected to the first side surface; and
there are also a plurality of third side surfaces, a quantity of the plurality of third side surfaces is equal to a quantity of the plurality of second step surfaces, the plurality of third side surfaces are in a one-to-one correspondence to the plurality of second step surfaces, and each third side surface is connected between an inner edge of the second step surface corresponding to the third side surface and the inner surface;
wherein the plurality of second step surfaces comprise at least three second step surfaces evenly arranged around the edge circumference of the inner surface, positions that are on an inner surface of the plastic edge portion and that correspond to the at least three second step surfaces are provided with second positioning post pull-out holes, the second positioning post pull-out hole extends along a direction perpendicular to the glass cover plate, and the second step surface and the third side surface connected to the second step surface form a partial inner surface region of the second positioning post pull-out hole.

10. The cover body structure according to claim 8, wherein the second step surface is disposed around the edge circumference of the inner surface, and the third side surface is disposed around the edge circumference of the inner surface;
wherein the second step surface comprises at least three step surface regions, the at least three step surface regions are evenly arranged around the edge circumference of the inner surface, positions that are on an inner surface of the plastic edge portion and that correspond to the at least three step surface regions are provided with second positioning post pull-out holes, the second positioning post pull-out hole extends along a direction perpendicular to the glass cover plate, and the step surface region and a partial region of the third side surface connected to the step surface region form a partial inner surface region of the second positioning post pull-out hole.

11. The cover body structure according to claim 5, wherein the glass cover plate further comprises a second step surface and a third side surface, the second step surface is located outside an edge of the inner surface, both the second step surface and the inner surface face a side that is of the plane on which the inner surface is located and that is away from the plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and
the first ink layer is further disposed on the second step surface, the first glue layer is further disposed on the first ink layer on the second step surface, and the plastic edge portion is further disposed on the first glue layer on the second step surface and the third side surface.

12. The cover body structure according to claim 1, wherein the glass cover plate comprises an outer surface, an inner surface, and a first side surface located between an edge circumference of the outer surface and an edge circumference of the inner surface, an edge of the first side surface close to the outer surface is connected to an edge circumference of the outer surface, the glass cover plate further comprises a second step surface and a third side surface, the second step surface is located outside an edge of the inner surface, both the second step surface and the inner surface face a side that is of a plane on which the inner surface is located and that is away from a plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and
the first ink layer is disposed on the second step surface, the first glue layer is disposed on the first ink layer on the second step surface, the plastic edge portion is disposed on the first side surface, the first glue layer on the second step surface, and the third side surface.

13. The cover body structure according to claim 1, wherein
the first ink layer comprises at least one of a color ink layer, a black ink layer, a white ink layer, or a transparent ink layer.

14. A back cover, comprising a back cover body and the cover body structure according to claim 1, wherein
the back cover body comprises an outer surface and an inner surface opposite to each other, and an opening passing through the outer surface of the back cover body and the inner surface of the back cover body is provided on the back cover body; and
the cover body structure is disposed at the opening, an orientation of an outer surface of a glass cover plate of the cover body structure is the same as an orientation of the outer surface of the back cover body, and a plastic edge portion of the cover body structure is fixed to an edge of the back cover body at the opening.

15. The back cover according to claim 14, further comprising:
a second ink layer, disposed at least on the edge of the back cover body at the opening; and a second glue layer, disposed on the second ink layer on the edge of the back cover body at the opening, wherein the plastic edge portion is further disposed on the second glue layer on the edge of the back cover body at the opening; and the second glue layer is a glue layer viscous at least at an injection molding temperature of the plastic edge portion, and the second ink layer is an ink layer that is able to withstand the injection molding temperature of the plastic edge portion.

16. An electronic device, comprising a camera module, a back cover body and the cover body structure, the cover body structure comprises: a glass cover plate; a first ink layer, disposed at least on an edge of the glass cover plate; a first glue layer, disposed on the first ink layer on the edge of the glass cover plate; and a plastic edge portion, disposed on the first glue layer on the edge of the glass cover plate, wherein the first glue layer is a glue layer viscous at least at an injection molding temperature of the plastic edge portion, and the first ink layer is an ink layer that is able to withstand the injection molding temperature of the plastic edge portion, wherein the back cover body comprises an outer surface and an inner surface opposite to each other, and an opening passing through the outer surface of the back cover body and the inner surface of the back cover body is provided on the back cover body;

the cover body structure is disposed at the opening, wherein an orientation of an outer surface of the glass cover plate is the same as an orientation of the outer surface of the back cover body, and the plastic edge portion is fixed to an edge of the back cover body at the opening; and the camera module is disposed on an inner side of the cover body structure, and a light-incident surface of the camera module faces a glass cover plate of the cover body structure.

17. The electronic device according to claim 16, wherein the glass cover plate comprises an outer surface, an inner surface, and a first side surface located between an edge circumference of the outer surface and an edge circumference of the inner surface, the inner surface comprises an edge region, the first ink layer is disposed at least on the edge region, the first glue layer is disposed on the first ink layer on the edge region, the plastic edge portion is disposed on the first side surface and the first glue layer on the edge region, the plastic edge portion is disposed around an edge circumference of the glass cover plate, and the plastic edge portion and the glass cover plate enclose an accommodating groove on a side of the inner surface away from the outer surface.

18. The electronic device according to claim 16, wherein the glass cover plate comprises an outer surface, an inner surface, and a first side surface located between an edge circumference of the outer surface and an edge circumference of the inner surface, the glass cover plate further comprises a first step surface and a second side surface, the first step surface is located outside an edge of the outer surface, both the first step surface and the outer surface face a side that is of a plane on which the outer surface is located and that is away from a plane on which the inner surface is located, the first step surface has an outer edge away from a center of the outer surface and an inner edge close to the center of the outer surface, the outer edge of the first step surface is connected to an edge of the first side surface close to the outer surface, the second side surface is connected between the inner edge of the first step surface and the outer surface, and a distance from the first step surface to the inner surface is less than a distance from the outer surface to the inner surface; and the first ink layer is disposed at least on the first step surface, the first glue layer is disposed at least on the first ink layer on the first step surface, and the plastic edge portion is disposed on the first side surface, the first glue layer on the first step surface, and the second side surface.

19. The electronic device according to claim 16, wherein the glass cover plate comprises an outer surface, an inner surface, and a first side surface located between an edge circumference of the outer surface and an edge circumference of the inner surface, an edge of the first side surface close to the outer surface is connected to an edge circumference of the outer surface, the glass cover plate further comprises a second step surface and a third side surface, the second step surface is located outside an edge of the inner surface, both the second step surface and the inner surface face a side that is of a plane on which the inner surface is located and that is away from a plane on which the outer surface is located, the second step surface has an outer edge away from a center of the inner surface and an inner edge close to the center of the inner surface, the outer edge of the second step surface is connected to an edge of the first side surface close to the inner surface, the third side surface is connected between the inner edge of the second step surface and the inner surface, and a distance from the second step surface to the outer surface is less than a distance from the inner surface to the outer surface; and the first ink layer is disposed on the second step surface, the first glue layer is disposed on the first ink layer on the second step surface, the plastic edge portion is disposed on the first side surface, the first glue layer on the second step surface, and the third side surface.

* * * * *